United States Patent
Yokokawa et al.

(10) Patent No.: US 7,246,296 B2
(45) Date of Patent: Jul. 17, 2007

(54) ENCODING DEVICE FOR PERFORMING SERIAL CONCATENATED CODING

(75) Inventors: Takashi Yokokawa, Tokyo (JP);
Toshiyuki Miyauchi, Tokyo (JP);
Yasuhiro Iida, Tokyo (JP); Kohei Yamamoto, Kanagawa (JP); Masayuki Hattori, Kanagawa (JP)

(73) Assignee: Sony Corporation, Tokyo (JP)

( * ) Notice: Subject to any disclaimer, the term of this patent is extended or adjusted under 35 U.S.C. 154(b) by 332 days.

(21) Appl. No.: 10/498,936

(22) PCT Filed: Oct. 8, 2003

(86) PCT No.: PCT/JP03/12854

§ 371 (c)(1),
(2), (4) Date: Jun. 16, 2004

(87) PCT Pub. No.: WO2004/038930

PCT Pub. Date: May 6, 2004

(65) Prior Publication Data

US 2005/0010848 A1 Jan. 13, 2005

(30) Foreign Application Priority Data

Oct. 23, 2002 (JP) ............................. 2002-307965

(51) Int. Cl.
*H03M 13/00* (2006.01)

(52) U.S. Cl. ..................................... 714/755; 714/758

(58) Field of Classification Search ................ 714/792, 714/755, 758
See application file for complete search history.

(56) References Cited

U.S. PATENT DOCUMENTS

| | | | | |
|---|---|---|---|---|
| 5,017,883 A | * | 5/1991 | Divsalar et al. | 329/304 |
| 5,023,889 A | * | 6/1991 | Divsalar et al. | 375/244 |
| 5,644,592 A | * | 7/1997 | Divsalar et al. | 375/147 |
| 5,996,104 A | * | 11/1999 | Herzberg | 714/755 |
| 6,023,783 A | * | 2/2000 | Divsalar et al. | 714/792 |
| 6,901,548 B2 | * | 5/2005 | Hattori et al. | 714/755 |
| 7,000,174 B2 | * | 2/2006 | Mantha et al. | 714/790 |

FOREIGN PATENT DOCUMENTS

| | | |
|---|---|---|
| JP | 2001-285375 | 10/2001 |
| JP | 2001-292185 | 10/2001 |
| JP | 2003-324356 | 11/2003 |
| JP | 2003-324357 | 11/2003 |

* cited by examiner

*Primary Examiner*—Guy Lamarre
*Assistant Examiner*—Mujtaba K. Chaudry
(74) *Attorney, Agent, or Firm*—Sonnenschein Nath & Rosenthal LLP

(57) ABSTRACT

The present invention is particularly applied to serial concatenated coding and serial concatenated trellis coded modulation. In second encoding 107, which is inner coding, a sequence that is not encoded or that is encoded so as to produce a finite impulse response and a sequence that is encoded so as to produce an infinite impulse response are output. In interleaving 106 before the second encoding 107, the sequences are permuted so as not to be mixed with each other.

27 Claims, 25 Drawing Sheets

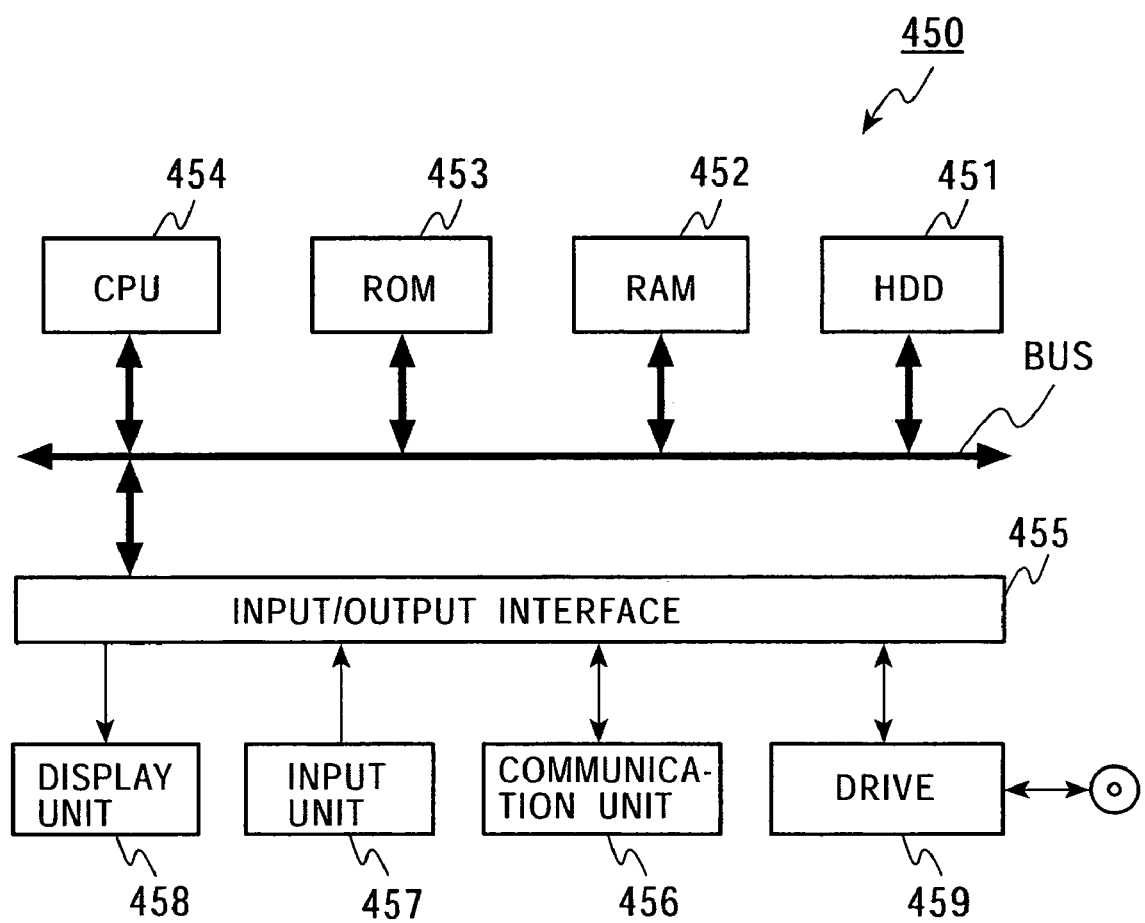

ENCODING DEVICE FOR PERFORMING SERIAL CONCATENATED CODING

BACKGROUND OF THE INVENTION

The present invention relates to an encoding device, an encoding method, an encoding program, a decoding device, a decoding method, and a decoding program. In particular, the present invention is applicable to serial concatenated coding and serial concatenated trellis coded modulation. In the present invention, in second coding, which is inner coding, a sequence that is not coded or that is coded so as to produce a finite impulse response and a sequence that is coded so as to produce an infinite impulse response are output, and, in interleaving before the second encoding, the sequences are permuted so as not to be mixed with each other, thus improving the performance over the related art.

With the recent research and development in the communication field including mobile communications and deep space communications, the broadcasting field including terrestrial digital broadcasting and satellite digital broadcasting, recording and playback apparatuses, and so forth, studies on coding theory have been extensively conducted for the purpose of efficient error-correcting coding and decoding.

In such coding theory, the so-called Shannon limit is known, which is given by the Shannon's channel coding theorem. The Shannon's channel coding theorem shows one theoretical limit of code performance, which indicates the theoretical limit of transmission rate that permits transmission without error. The Shannon's channel coding theorem is that "there exists a coding scheme that yields an error probability as close to "0" as possible if $R \leq C$, where information is transmitted at a transmission rate R [bit/symbol] using a communication channel with a channel capacity C [bit/symbol]."

One known coding scheme that shows performance near the Shannon limit is coding of serial concatenated convolutional codes (hereinafter referred to as SCCC), which is described in, for example, S. Benedetto, G. Montorsi, D. Divsalar, and F. Pollara, "Serial Concatenation of Interleaved Codes: Performance Analysis, Design, and Iterative Decoding", TDA Progress Report 42-126, Jet Propulsion Laboratory, Pasadena, Calif., Aug. 15, 1996.

Coding of serial concatenated convolutional codes is performed by a device including a serial concatenation of a first convolutional encoder, an interleaver, and a second convolutional encoder. Decoding of serial concatenated convolutional codes is performed by a device including two decoding circuits that output soft-output, which are connected via a de-interleaver and an interleaver.

One known application of coding of serial concatenated convolutional codes is serial concatenated trellis coded modulation (hereinafter referred to as SCTCM), which is described in, for example, D. Divsalar and F. Pollara, "Serial and Hybrid Concatenation Codes with Applications", in Proc., Int. Symp. on Turbo Codes and Related Topics, Brest, France, pp. 80-87, September 1997. The SCTCM coding is a combination of coding of serial concatenated convolutional codes and multi-level modulation, and takes into consideration the entirety of the code constellation of modulated codes and the decoding characteristics of error-correcting codes.

FIG. 1 is a block diagram of a communication model in SCCC and SCTCM. In such a communication model, an encoding device 2 in a transmitter encodes digital information D1 with serial concatenated convolutional codes, and transmits the encoded output D2 to a receiver via a noisy memoryless channel 3, and then a decoding device 4 in the receiver decodes the transmitted output D3. In SCCC and SCTCM, an SCCC encoding device 2A and decoding device 4A and an SCTCM encoding device 2B and decoding device 4B, which correspond to the encoding device 2 and the decoding device 4, are used, respectively.

FIG. 2 is a block diagram of the SCCC encoding device 2A. The encoding device 2A includes a serial concatenation of a convolutional encoder 5 for encoding a first code, which is an outer code, an interleaver 6, and a convolutional encoder 7 for encoding a second code, which is an inner code. In the encoding device 2A, the convolutional encoder 5 performs convolutional coding on input data D1 with code rate 1/2 to convert the 1-bit input data D1 into 2-bit coded output data D6, and outputs the result.

FIG. 3 is a block diagram showing the structure of the convolutional encoder 5. In the convolutional encoder 5, the input data D1 is input to a series circuit of an exclusive OR circuit 8 and shift registers 9 and 10. The output data of the shift registers 9 and 10 are exclusive ORed by an exclusive OR circuit 11, and the resulting exclusive OR is then input to the exclusive OR circuit 8. The outputs of the exclusive OR circuit 8 and the shift register 10 are exclusive ORed by an exclusive OR circuit 12. The convolutional encoder 5 outputs the input data D1 and the output data of the exclusive OR circuit 12 to the subsequent interleaver 6. In the convolutional encoder 5, therefore, the input data D1 is convolutional coded with code rate 1/2, and the two bit sequences of output data D6 is output.

The interleaver 6 interleaves and permutes the order of the output data D6 output from the convolutional encoder 5, and outputs the result. FIG. 4 is a block diagram of an example structure of the interleaver 6. In the interleaver 6, the output data D6 of the convolutional encoder 5 is temporarily stored in an input data storage memory 15, and is then input to a subsequent data permuting circuit 16. The data permuting circuit 16 permutes the order of the output data from the input data storage memory 15 based on data permutation position information recorded in a permutation data ROM (Read Only Memory) 17, and outputs the result. The output data of the data permuting circuit 16 is temporarily stored in a subsequent output data storage memory 18, and is then output.

The convolutional encoder 7 performs convolutional coding on the output data D7 of the interleaver 6 with code rate 2/2, and outputs the output data D2. FIG. 5 is a block diagram showing an example structure of the convolutional encoder 7. In the convolutional encoder 7, the sequences of output data D7 from the interleaver 6 are input to a series circuit of an exclusive OR circuit 21 and a shift register 22, and to a series circuit of an exclusive OR circuit 23 and a shift register 24, respectively. The output data of the shift registers 22 and 24 are fed back to the exclusive OR circuits 21 and 23. Moreover, on the side of one sequence, the output data of the shift register 24 on the side of the other sequence is fed back to the exclusive OR circuit 21, and on the side of the other sequence, the output data of the exclusive OR circuit 21 on the side of one sequence is fed back to the exclusive OR circuit 23. In this manner, the convolutional encoder 7 performs convolutional coding on the output data D7 of the interleaver 6 with code rate 2/2.

Accordingly, the convolutional encoders 5 and 7 perform coding with code rates 1/2 and 2/2, and, finally, the encoding device 2A performs serial concatenated convolutional coding with code rate (1/2)×(2/2)=1/2. The serial-concatenated convolutional coded output data is input to the decoding device 4A in the receiver via the memoryless channel 3.

FIG. 6 is a block diagram showing an example structure of the SCCC decoding device 4A. The decoding device 4A includes soft-output decoding circuits 33 and 34 that decode an inner code and an outer code, respectively, which are connected via a de-interleaver 31 and an interleaver 32. In the decoding device 4A, the data D3 from the memoryless channel 3 is input to the soft-output decoding circuit 33 that decodes an inner code. The data D3 from the memoryless channel 3 contains the noise generated in the memoryless channel 3. In the decoding device 4A, the data D3 and the output data of the interleaver 32 that take analog values are input, as soft-inputs, to the soft-output decoding circuit 33.

The soft-output decoding circuit 33 corresponds to the convolutional encoder 7 of the encoding device 2A, and performs MAP (maximum a-posteriori probability) decoding, SOVA (soft-output Viterbi algorithm) decoding, or the like, based on the so-called BCJR (Bahl, Cocke, Jelinek, and Raviv) algorithm. The soft-output decoding circuit 33 receives soft-input information bits D8 that are supplied from the interleaver 32 as a-priori probability information, and sequentially processes the a-priori probability information and the received word, i.e., the output data D3, of the memoryless channel 3 in accordance with the code constraint condition, thereby performing soft-output decoding on the inner code. In this manner, the soft-output decoding circuit 33 outputs the soft-output D9, which corresponds to the output data D7 of the interleaver 6 in the encoding device 2A.

The de-interleaver 31 corresponds to the interleaver 6 of the encoding device 2A, and reversely reorders the soft-output D9 output from the soft-output decoding circuit 33 to the input/output order as in the interleaver 6, and outputs the result.

The subsequent soft-output decoding circuit 34 corresponds to the convolutional encoder 5 of the encoding device 2A. Like the soft-output decoding circuit 33, the soft-output decoding circuit 34 performs MAP decoding, SOVA decoding, or the like based on the BCJR algorithm. Specifically, the soft-output decoding circuit 34 uses the a-priori probability information, which is soft-input D10 of the de-interleaver 31, and a-priori probability information, which corresponds to an information bit of value "0", to perform soft-output decoding on the outer code in order to output hard-output decoded data D4. In the processing, the soft-output decoding circuit 34 generates a-posteriori probability information D11 that corresponds to the coded bits in accordance with the code constraint condition, and outputs the a-posteriori probability information D11, as soft-output, to the interleaver 32. The interleaver 32 permutes the a-posteriori probability information D11 according to the same order as in the interleaver 6 of the encoding device 2A, and outputs the a-priori probability information D8 to the soft-output decoding circuit 33.

With the structure described above, upon receiving the received word D3, the decoding device 4A iterates the decoding processing of the soft-output decoding circuit 33 to the soft-output decoding circuit 34 a predetermined number of times (for example, several times to tens of times), and outputs the decoded data D4 based on the soft-output extrinsic information obtained by the iterative decoding.

FIG. 7 is a block diagram showing an example structure of the SCTCM encoding device 2B. The encoding device 2B includes a serial concatenation of an outer-code convolutional encoder 41, an interleaver 42, an inner-code convolutional encoder 43, and a multi-level modulation mapping circuit 44.

The outer-code convolutional encoder 41 performs convolutional coding on input data D1 with code rate 2/3 to convert the 2-bit input data D1 into 3-bit coded output data D21, and outputs the result.

As shown in FIG. 8, in the convolutional encoder 41, an exclusive OR circuit 51 determines the exclusive OR of the input data D1 (D11 and D12), and the result of the exclusive OR circuit 51 is input to an exclusive OR circuit 53 via a shift register 52. The exclusive OR circuit 53 determines the exclusive OR of this result and the bit sequence D11 of the input data D1. The result of the exclusive OR circuit 53 is input to an exclusive OR circuit 55 via a shift register 54. The exclusive OR circuit 55 determines the exclusive OR of the result of the exclusive OR circuit 53 and the two bit sequences D11 and D12 of the input data D1 to generate a bit sequence D213. The convolutional encoder 41 outputs the bit sequence D213 and the two bit sequences D11 and D12 of the input data D1 (i.e., D211 and D212), thus performing convolutional coding with code rate 2/3.

The interleaver 42 has a structure similar to that of the interleaver 6 described above with reference to FIG. 4, and permutes the order of the output data D21 output from the convolutional encoder 41 before outputting the data.

The inner-code convolutional encoder 43 performs convolutional coding on output data D22 of the interleaver 42 with code rate 3/3 to output data D23. As shown in FIG. 9, in the convolutional encoder 43, three bit sequences D221 to D223 constituting the output data D22 of the interleaver 42 are input to an exclusive OR circuit 56 to determine the exclusive OR of these bit sequences and the output data of a shift register 57. The output of the exclusive OR circuit 56 is fed back to the shift register 57. The convolutional encoder 43 outputs the exclusive ORed bit sequence D233 and the two bit sequences D222 and D223 of the input data D22 (i.e., D231 and D232), thus performing convolutional coding with code rate 3/3.

The multi-level modulation mapping circuit 44 maps signal points using a predetermined modulation method. Specifically, the multi-level modulation mapping circuit 44 maps the 3-bit output data D23 output from the convolutional encoder 43 onto a transmission symbol using, for example, 8PSK (8-phase shift keying) modulation. The encoding device 2B transmits the output data D2 of the multi-level modulation mapping circuit 44 to a communicating party.

Accordingly, the convolutional encoders 41 and 43 perform coding with code rates 2/3 and 3/3, respectively, and, finally, the encoding device 2B performs serial concatenated convolutional coding with code rate 2/3 to output the output data D2.

FIG. 10 is a block diagram showing an example structure of the SCTCM decoding device 4B. The decoding device 4B includes soft-output decoding circuits 63 and 64 that decode an inner code and an outer code, respectively, which are connected via a de-interleaver 61 and an interleaver 62. In the decoding device 4B, the data D3 from the memoryless channel 3 is input to the soft-output decoding circuit 63 that decodes an inner code. The data D3 from the memoryless channel 3 contains the noise generated in the memoryless channel 3. In the decoding device 4B, the data D3 and output data D34 of the interleaver 32 that take analog values are input, as soft-inputs, to the soft-output decoding circuit 63.

The soft-output decoding circuit 63 corresponds to the convolutional encoder 43 and the multi-level modulation mapping circuit 44 of the encoding device 2B, and sequentially processes soft-input information bits D34, which are supplied from the interleaver 62, and the received word, i.e., the output data D3, of the memoryless channel 3 by MAP decoding, SOVA decoding, or the like based on the so-called BCJR algorithm to perform soft-output decoding on the inner code. In this manner, the soft-output decoding circuit 63 outputs the soft-output D31 which corresponds to the output data D22 of the interleaver 42 in the encoding device 2A.

The de-interleaver 61 corresponds to the interleaver 42 of the encoding device 2B, and reversely reorders the soft-output D31 output from the soft-output decoding circuit 63 to the input/output order as in the interleaver 42, and outputs the result.

The subsequent soft-output decoding circuit 64 corresponds to the convolutional encoder 41 of the encoding device 2B. Like the soft-output decoding circuit 63, the soft-output decoding circuit 64 performs MAP decoding, SOVA decoding, or the like based on the BCJR algorithm to perform soft-output decoding on the outer code in order to output hard-output decoded data D4. The soft-output decoding circuit 64 further generates a-posteriori probability information D33 that corresponds to the coded bits, and outputs the a-posteriori probability information D33, as soft-output, to the interleaver 62. The interleaver 62 permutes the a-posteriori probability information D33 according to the same order as in the interleaver 42 of the encoding device 2B, and outputs a-priori probability information D34 to the soft-output decoding circuit 63.

With the structure described above, upon receiving the received word D3, likewise, the decoding device 4B iterates the decoding processing of the soft-output decoding circuit 63 to the soft-output decoding circuit 64 a predetermined number of times, and outputs the decoded data D4 based on the soft-output extrinsic information obtained by the iterative decoding.

However, such SCCC and SCTCM systems have a problem in that there is a large difference between the logical limit and the actual performance, and therefore, there is still room for improvement in the performance.

FIGS. 11 and 12 show the performances of the SCCC and SCTCM systems, respectively, in relation to the signal-to-noise power ratio ($E_b/N_o$) per bit and the bit error rate on the x-axis and the y-axis, respectively. The performance of the SCTCM system is obtained in a case where the signal points are mapped by the multi-level modulation mapping circuit 44 onto the constellation shown in FIG. 13, wherein the sum of input distances between codewords, that is, minimum Euclidean distances, is 16.

As shown in FIG. 11, the SCCC system exhibits the so-called waterfall phenomenon at a signal-to-noise power ratio ($E_b/N_o$) of about 2.0 dB. The waterfall phenomenon is a phenomenon wherein the error rate rapidly drops from as high as about $10^{-1}$ as the signal-to-noise power ratio ($E_b/N_o$) increases. The theoretical limit for the code rate of this system is about 0.2 dB, and therefore, there is still room for improvement in the performance.

As shown in FIG. 12, the SCTCM system exhibits the waterfall phenomenon at a signal-to-noise power ratio ($E_b/N_o$) of about 3.4 dB. The theoretical limit for the code rate of this system is about 2.8 dB, and therefore, also, there is still room for improvement in the performance.

SUMMARY OF THE INVENTION

The present invention has been made in view of the foregoing, and is intended to provide an encoding device, an encoding method, an encoding program, a decoding device, a decoding method, and a decoding program with improved performance over the related art.

In order to overcome the problems described above, the present invention provides an encoding device for performing serial concatenated coding on k bit sequences of input data, wherein second encoding means outputs data, wherein one or more bit sequences of p bit sequences of data output from permuting means are not encoded or are encoded so as to produce a finite impulse response and the remaining bit sequences of data are encoded so as to produce an infinite impulse response, and the permuting means permutes the p bit sequences of data so that the bit sequences that are encoded so as to produce an infinite impulse response by the second encoding means are not mixed with the other bit sequence or sequences and outputs the permuted data.

According to the structure of the present invention, in the encoding device, the second encoding means outputs data, wherein one or more bit sequences of the p bit sequences of data output from the permuting means are not encoded or are encoded so as to produce a finite impulse response and the remaining bit sequences of data are encoded so as to produce an infinite impulse response. Thus, the waterfall phenomenon is exhibited in a region with low signal-to-noise power ratio. Moreover, the permuting means permutes the p bit sequences of data so that the bit sequences that are encoded so as to produce an infinite impulse response by the second encoding means are not mixed with the other bit sequence or sequences, and outputs the permuted data. Thus, the occurrence of the error floor is prevented. Therefore, the performance is improved over the related art.

Furthermore, the present invention provides an encoding method for performing serial concatenated coding on k bit sequences of input data, wherein a second encoding step includes outputting data, wherein one or more bit sequences of p bit sequences of data permuted in a permuting step are not encoded or are encoded so as to produce a finite impulse response and the remaining bit sequences of data are encoded so as to produce an infinite impulse response, and the permuting step includes permuting the p bit sequences of data so that the bit sequences that are encoded so as to produce an infinite impulse response in the second encoding step are not mixed with the other bit sequence or sequences, and outputting the permuted data.

According to the structure of the present invention, therefore, an encoding method with improved performance over the related art is provided.

Furthermore, the present invention provides an encoding program that causes a computer to execute a predetermined procedure to perform serial concatenated coding on k bit sequences of input data, wherein a second encoding step includes outputting data, wherein one ore more bit sequences of p bit sequences of data permuted in a permuting step are not encoded or are encoded so as to produce a finite impulse response and the remaining bit sequences of data are encoded so as to produce an infinite impulse response or sequences, and the permuting step includes permuting the p bit sequences of data so that the bit sequences that are encoded so as to produce an infinite impulse response in the second encoding step are not mixed with the other bit sequence or sequences, and outputting the permuted data.

According to the structure of the present invention, therefore, an encoding program with improved performance over the related art is provided.

Furthermore, the present invention provides a decoding device for decoding a code generated by a predetermined encoding method. In the encoding method, a second encoding step includes outputting data, wherein one or more bit sequences of p bit sequences of data permuted in a permuting step are not encoded or are encoded so as to produce a finite impulse response and the remaining bit sequences of data are encoded so as to produce an infinite impulse response, and the permuting step includes permuting the p bit sequences of data so that the bit sequences that are encoded so as to produce an infinite impulse response in the second encoding step are not mixed with the other bit sequence or sequences, and outputting the permuted data. The decoding device includes first soft-output decoding means for, correspondingly to the second encoding step, performing soft-output decoding on extrinsic information that corresponds to the p bit sequences of data based on a soft-input received word and a-priori probability information; first permuting means serial concatenated with the first soft-output decoding means for, correspondingly to the permuting step, permuting the extrinsic information that corresponds to the p bit sequences of data and outputting the permuted data; second soft-output decoding means serial concatenated with the first permuting means for, correspondingly to a first encoding step, performing soft-output decoding on extrinsic information that corresponds to the k bit sequences of input data and a-posteriori probability information based on the extrinsic information output from the first permuting means; and second permuting means for permuting the a-posteriori probability information and outputting the a-priori probability information.

According to the structure of the present invention, therefore, a decoding device with improved performance over the related art is provided.

Furthermore, the present invention provides a decoding method for decoding a code generated by a predetermined encoding method. In the encoding method, a second encoding step includes outputting data, wherein one or more bit sequences of p bit sequences of data permuted in a permuting step are not encoded or are encoded so as to produce a finite impulse response and the remaining bit sequences of data are encoded so as to produce an infinite impulse response, and the permuting step includes permuting the p bit sequences of data so that the bit sequences that are encoded so as to produce an infinite impulse response in the second encoding step are not mixed with the other bit sequence or sequences, and outputting the permuted data. The decoding method includes a first soft-output decoding step of, correspondingly to the second encoding step, performing soft-output decoding on extrinsic information that corresponds to the p bit sequences of data based on a soft-input received word and a-priori probability information; a first permuting step serial concatenated with the first soft-output decoding of, correspondingly to the permuting step, permuting the extrinsic information that corresponds to the p bit sequences of data and outputting the permuted data; a second soft-output decoding step serial concatenated with the first permuting step of, correspondingly to the first encoding step, performing soft-output decoding on extrinsic information that corresponds to the k bit sequences of input data and a-posteriori probability information based on the extrinsic information permuted in the first permuting step; and a second permuting step of permuting the a-posteriori probability information and outputting the a-priori probability information.

According to the structure of the present invention, therefore, a decoding method with improved performance over the related art is provided.

Furthermore, the present invention provides a decoding program that causes a computer to execute a predetermined procedure to decode a code generated by a predetermined encoding method. In the encoding method, a second encoding step includes outputting data, wherein one or more bit sequences of p bit sequences of data permuted in a permuting step are not encoded or are encoded so as to produce a finite impulse response and the remaining bit sequences of data are encoded so as to produce an infinite impulse response, and the permuting step includes permuting the p bit sequences of data so that the bit sequences that are encoded so as to produce an infinite impulse response in the second encoding step are not mixed with the other bit sequence or sequences, and outputting the permuted data. The predetermined procedure includes a first soft-output decoding step of, correspondingly to the second encoding step, performing soft-output decoding on extrinsic information that corresponds to the p bit sequences of data based on a soft-input received word and a-priori probability information; a first permuting step serial concatenated with the first soft-output decoding step of, correspondingly to the permuting step, permuting the extrinsic information that corresponds to the p bit sequences of data and outputting the permuted data; a second soft-output decoding step serial concatenated with the first permuting step of, correspondingly to the first encoding step, performing soft-output decoding on extrinsic information that corresponds to the k bit sequences of input data and a-posteriori probability information based on the extrinsic information permuted in the first permuting step; and a second permuting step of permuting the a-posteriori probability information and outputting the a-priori probability information.

According to the structure of the present invention, therefore, a decoding program with improved performance over the related art is provided.

BRIEF DESCRIPTION OF THE DRAWINGS

FIG. 37 is a block diagram showing a computer embodiment.

DETAILED DESCRIPTION OF THE PRESENTLY PREFERRED EMBODIMENTS

Embodiments of the present invention will now be described in detail with reference to the drawings, where applicable.

(1) First Embodiment (1-1) Structure of First Embodiment

Figure 14:
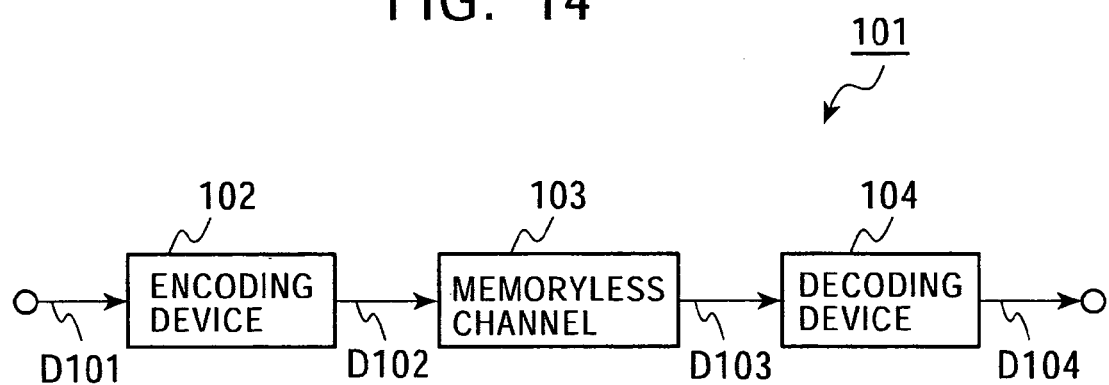
FIG. 14 is a block diagram of a data transmitting and receiving system according to a first embodiment of the present invention.

FIG. 14 is a block diagram of a data transmitting and receiving system according to a first embodiment of the present invention. In a data transmitting and receiving system 101, an encoding device 102 performs serial concatenated convolutional coding on digital information D101 according to the SCTCM scheme, and transmits the coded output D102 to a receiver via a noisy memoryless channel 103, and then a decoding device 104 in the receiver decodes the transmitted output D103.

Figure 15:
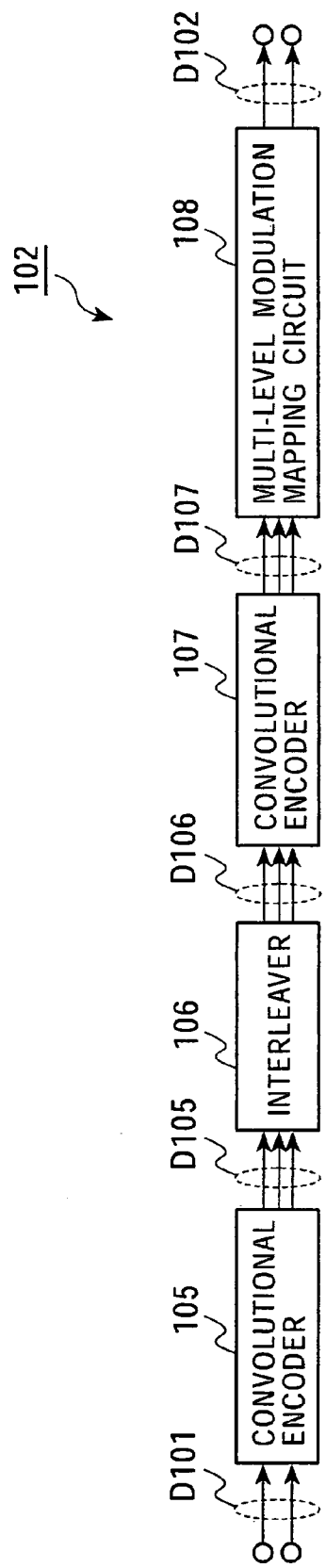
FIG. 15 is a block diagram of an encoding device in the data transmitting and receiving system shown in FIG. 14.

FIG. 15 is a block diagram showing the structure of the encoding device 102. In the encoding device 102, the digital information D101 is convolutional coded with code rate k/p by an outer-code convolutional encoder 105, which serves as first encoding means, and the output data D105 is then interleaved by an interleaver 106, which serves as permuting means. The resulting data is further convolutional coded with code rate p/n by an inner-code convolutional encoder 107, which serves as second encoding means, and is then 8PSK modulated and output by a multi-level modulation mapping circuit 108. Thus, finally, the encoding device 102 performs serial concatenated convolutional coding with code rate k/n to generate n bit sequences of coded data D107. The n bits of n sequences are mapped onto a coded transmission symbol, which is then output. In this embodiment, k, p, and n are set to 2, 3, and 3, respectively.

That is, the convolutional encoder 105 of the encoding device 102 receives the two bit sequences of input data D101, and performs outer coding to output the three bit sequences of output data D105.

The convolutional encoder 107 receives three bit sequences of input data D106 from the interleaver 106, and performs inner coding to output three bit sequences of output data D107. In this processing, the convolutional encoder 107 does not perform convolutional coding on at least one of p bit sequences constituting the input data D106; instead, it uses this bit sequence as finite impulse response (hereinafter referred to as FIR) codes, while using the remaining sequences as infinite impulse response (hereinafter referred to as IIR) codes for recursive systematic convolutional coding.

In this embodiment, therefore, in the p bit sequences of data output from the interleaver 106, one or more bit sequences are not encoded or are encoded so as to produce a finite impulse response, which are then output, while the remaining bit sequences of data are encoded so as to produce an infinite impulse response, which are then output.

Figure 11:
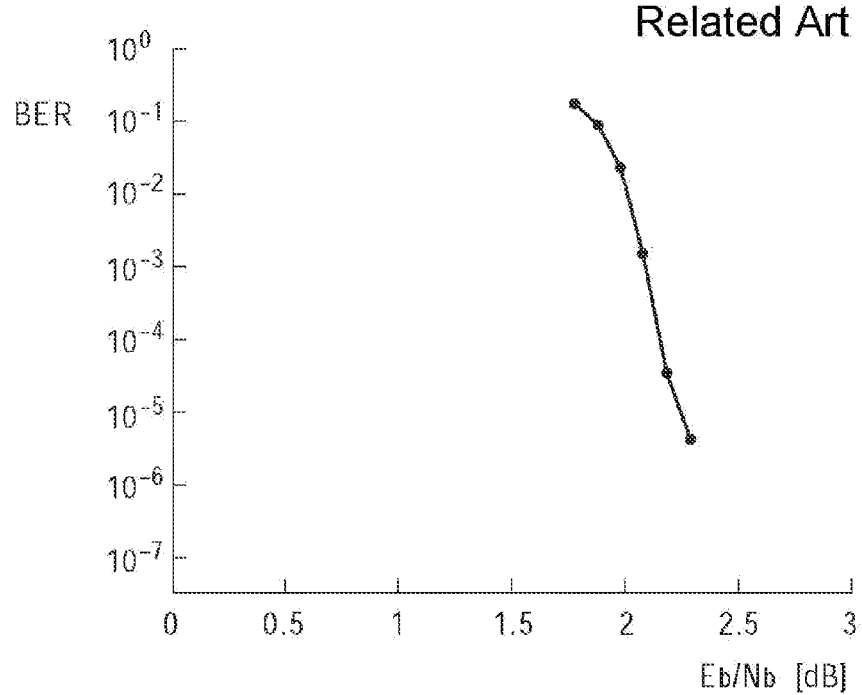
FIG. 11 is a characteristic curve diagram showing the characteristics of the data transmitting and receiving system shown in FIG. 1.
Figure 12:
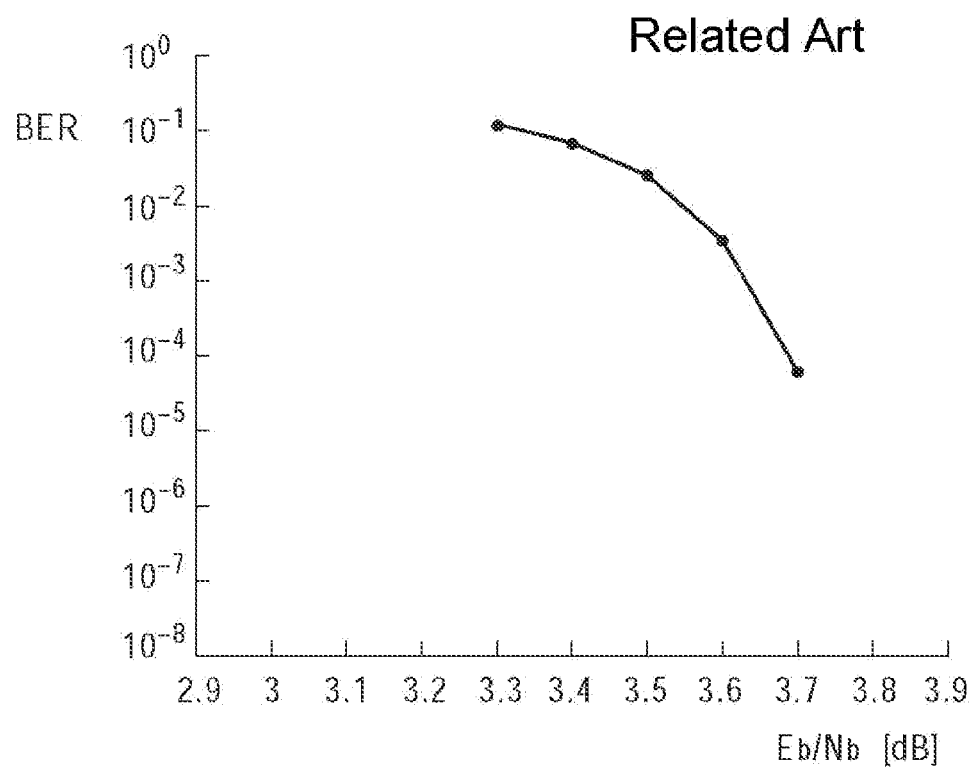
FIG. 12 is a characteristic curve diagram showing the characteristics of the data transmitting and receiving system shown in FIG. 7.
Figure 13:
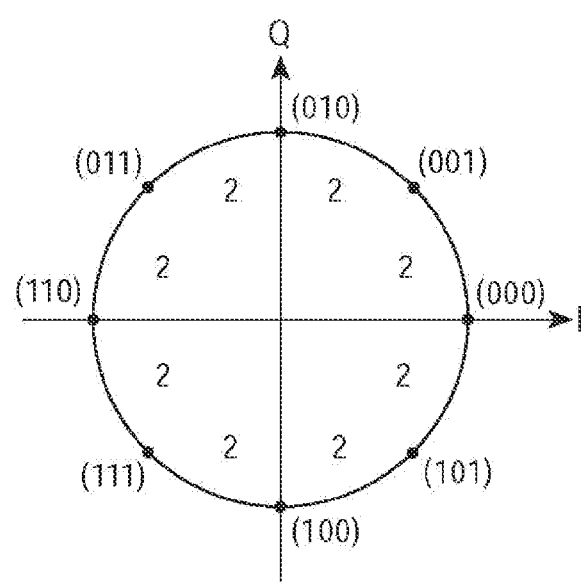
FIG. 13 is a characteristic curve diagram showing a mapping constellation that exhibits the characteristics shown in FIG. 12.
Figure 16:
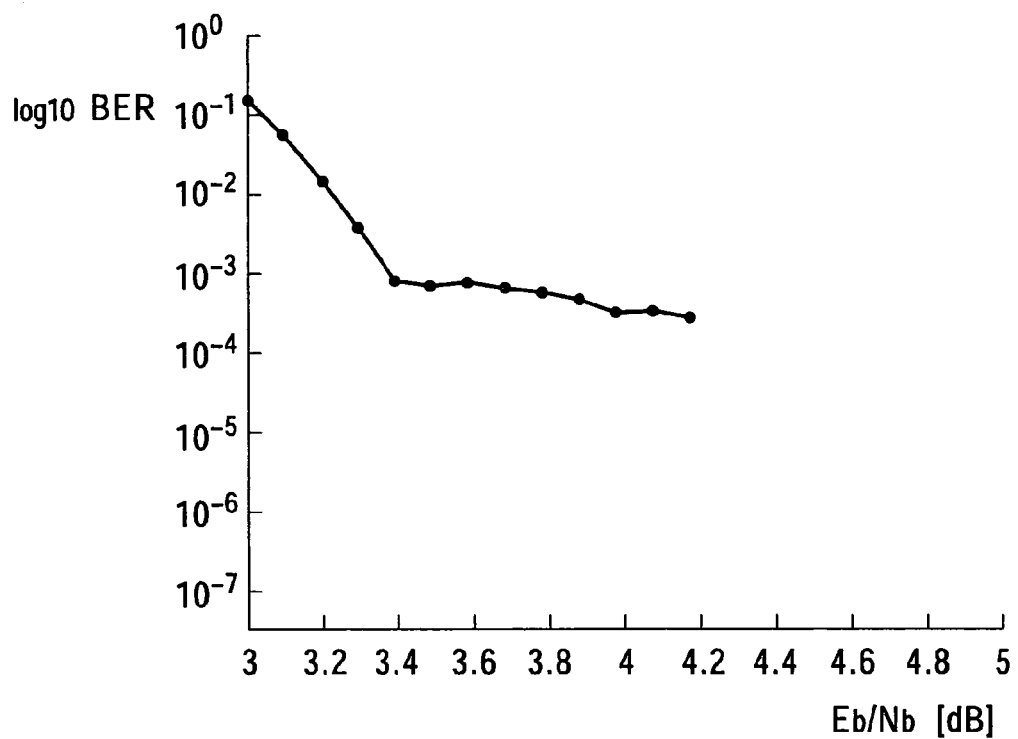
FIG. 16 is a characteristic curve diagram for showing the characteristics of the data transmitting and receiving system shown in FIG. 14.

As indicated by the performance curve shown in FIG. 16, which represents the relationship between the signal-to-noise power ratio ($E_b/N_o$) per bit and the bit error rate, compared to that shown in FIG. 11, the encoding device 102 exhibits the so-called waterfall phenomenon in a region with lower signal-to-noise power ratio ($E_b/N_o$) than that in the related art.

Figure 7:
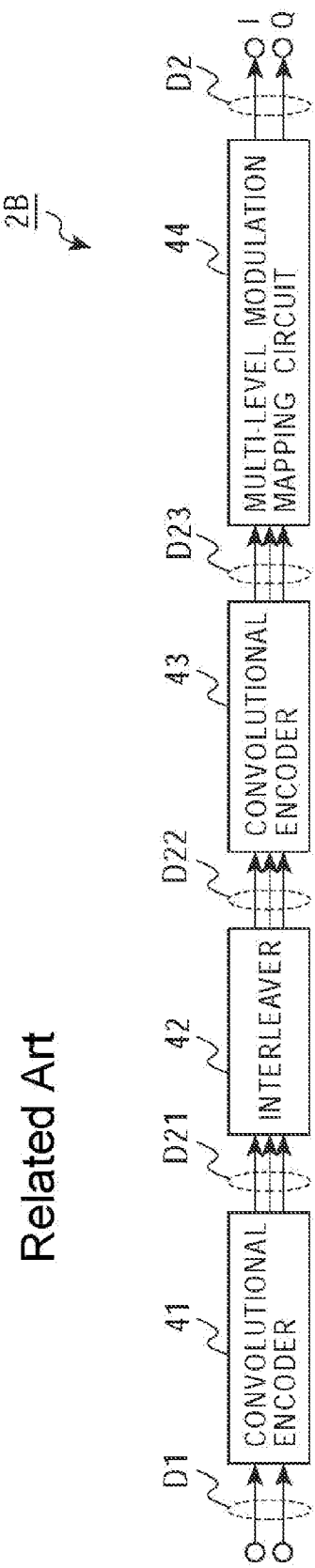
FIG. 7 is a block diagram of an encoding device in an SCTCM data transmitting and receiving system of the related art.
Figure 8:
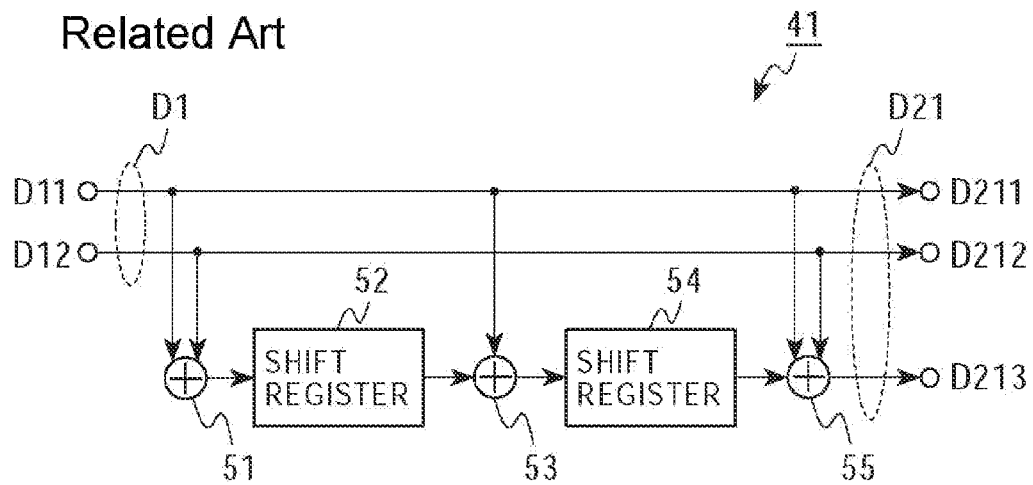
FIG. 8 is a block diagram of a convolutional encoder 41 of the encoding device shown in FIG. 7.
Figure 9:
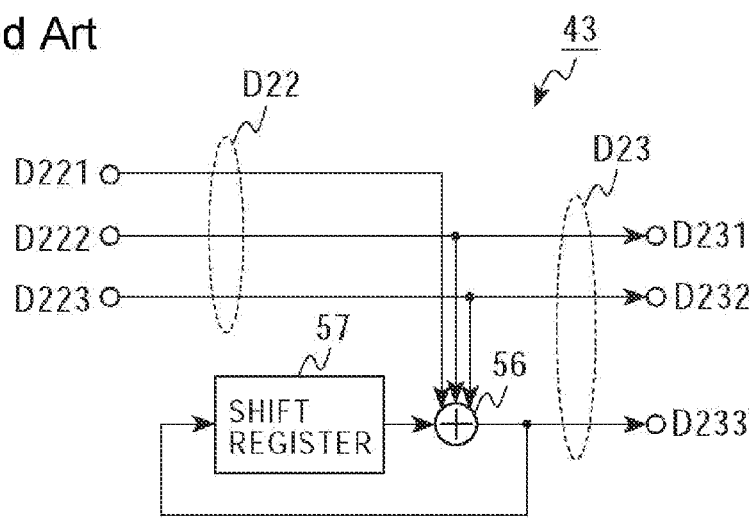
FIG. 9 is a block diagram of a convolutional encoder 43 of the encoding device shown in FIG. 7.
Figure 10:
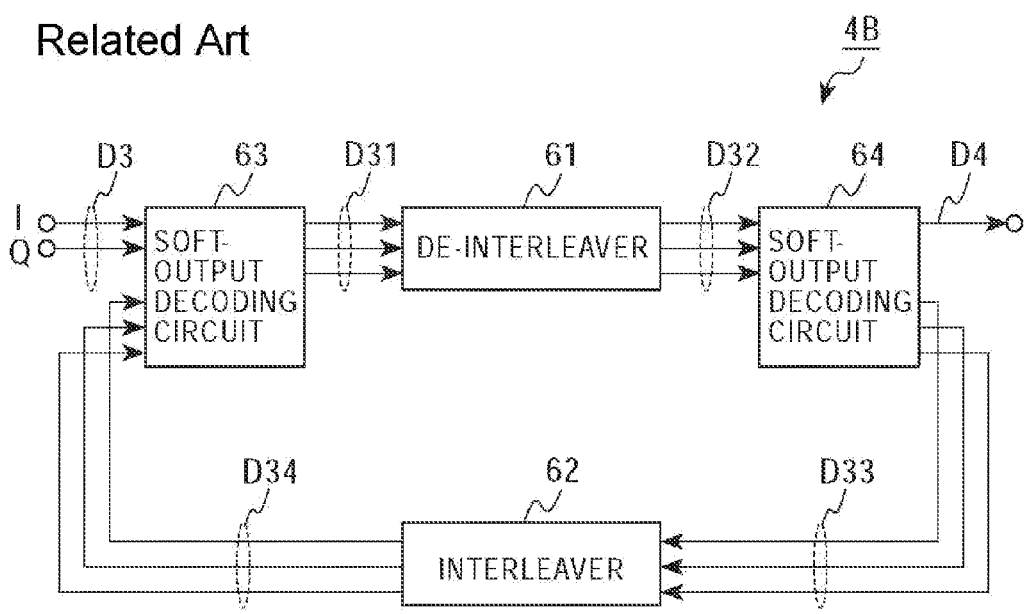
FIG. 10 is a block diagram of a decoding device corresponding to the encoding device shown in FIG. 7.

The characteristic shown in FIG. 16 is obtained in a case where the interleaver 42 described above with reference to FIG. 7 is employed rather than the interleaver 106, outer coding and inner coding are carried out with generator matrices $G_o$ and $G_I$ given by the equations below, respectively, and the signal points are mapped by the multi-level modulation mapping circuit 108 onto the constellation shown in FIG. 17, wherein the sum of minimum Euclidean distances is 12:

$$G_o = \begin{bmatrix} 1 & D & 1+D \\ D^2 & 1 & 1+D+D^2 \end{bmatrix} \quad (1)$$

$$G_I = \begin{bmatrix} 1 & 0 & 0 \\ 0 & 1 & 1/(1+D) \\ 0 & 1 & 1/(1+D) \end{bmatrix} \quad (2)$$

As can be seen from the performance curve shown in FIG. 16, the waterfall phenomenon is exhibited in a region with low signal-to-noise power ratio ($E_b/N_o$); however, the gradient of the characteristic curve changes at a bit error rate of about $10^{-3}$, exhibiting the phenomenon (error floor phenomenon) that the error rate drop caused by an increase of the signal-to-noise power ratio ($E_b/N_o$) is retarded midway.

In view of this, the interleaver 106 of the encoding device 102 interleaves the bit sequences so that the bit sequences for the IIR codes in the convolutional encoder 107 are not mixed with the remaining sequences in order to suppress the occurrence of the error floor phenomenon.

Figure 17:
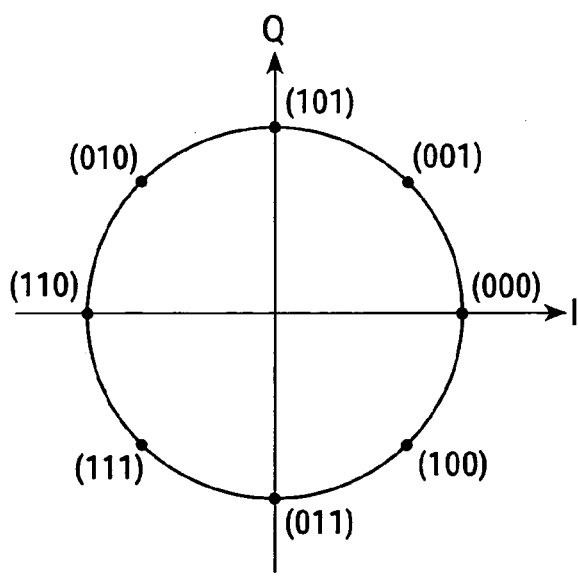
FIG. 17 is a characteristic curve diagram showing a mapping constellation that exhibits the characteristic curve diagram shown in FIG. 16.

The mapping constellation shown in FIG. 17 indicates that mapping is carried out so that the Hamming distance between the output codewords in which the Euclidean distance between transmission symbols is minimized is smaller than between other codewords, and, in outer coding, data that is coded so that the minimum distance between the output codewords is large is output. In this embodiment, this also contributes to the occurrence of the waterfall phenomenon in a region with low signal-to-noise power ratio ($E_b/N_o$).

It is believed that the error floor occurs because the probability of all weights of the outer interleaved code not being encoded in inner coding, that is, in this example, the probability of all weights of the outer code whose minimum weight is "4" being output as is without any convolutional operation of the convolutional encoder 107, is $(1/3)^4$. As generally known in the art, weights of an outer code are not concentrated if an encoding device performs inner coding on three bit sequences.

Figure 18:
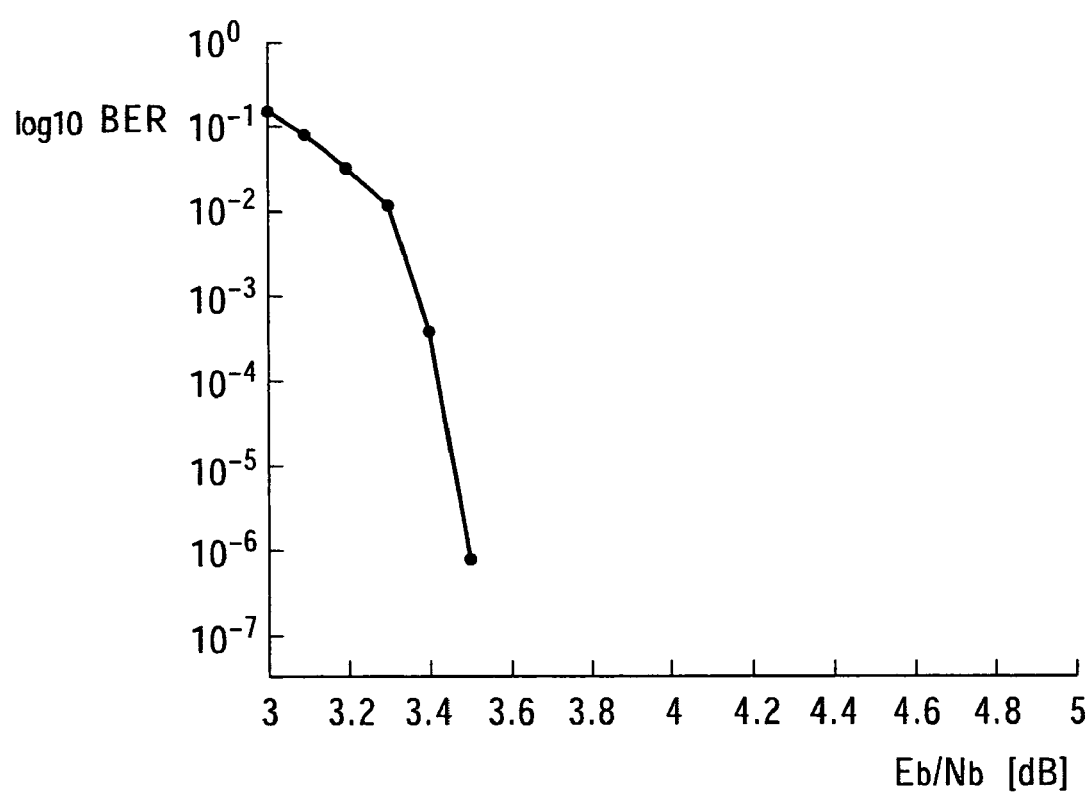
FIG. 18 is a characteristic curve diagram showing the characteristics of the data transmitting and receiving system shown in FIG. 14.

Thus, if all weights of the outer code are not input as the FIR codes to the convolutional encoder 107, it is believed that the occurrence of the error floor is suppressed. In this case, the interleaver 106 may have a variety of configurations in which, for example, bits of data are individually interleaved, bits of data are interleaved separately from the FIR codes, and so forth. It is assumed herein, by way of example, that the three bit sequences of input data are individually interleaved. As is shown in FIG. 18, compared to FIG. 16, the occurrence of the error floor can be suppressed. The characteristic shown in FIG. 18 is obtained in a case where the three bit sequences of input data are individually interleaved by the interleaver 106, unlike the characteristics shown in FIG. 16.

As is indicated by this performance curve, in comparison to that shown in FIG. 11, the waterfall phenomenon is exhibited in a region with lower signal-to-noise power ratio $E_b/N_o$ than that in the related art, and no error floor occurs, leading to improved performance over the related art.

Figure 19:
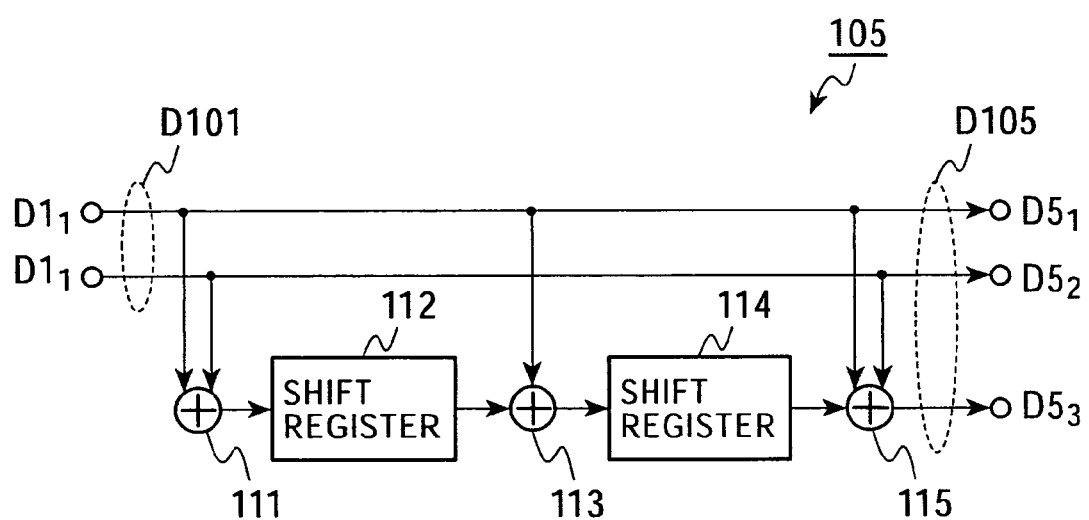
FIG. 19 is a block diagram of a convolutional encoder 105 shown in FIG. 15.

FIG. 19 is a block diagram showing the detailed structure of the convolutional encoder 105 of the encoding device 102. In the convolutional encoder 105, an exclusive OR circuit 111 determines the exclusive OR of the input data D101 (i.e., $D1_1$ $_{and\ D12}$), and the result of the exclusive OR circuit 111 is input to an exclusive OR circuit 113 via a shift register 112. The exclusive OR circuit 113 determines the exclusive OR of this result and the bit sequence $D1_1$ of the input data D101. The result of the exclusive OR circuit 113 is input to an exclusive OR circuit 115 via a shift register 114. The exclusive OR circuit 115 determines the exclusive OR of the result of the exclusive OR circuit 113 and the two bit sequences $D1_1$ and $D1_2$ of the input data D101 to generate a bit sequence $D5_3$. The convolutional encoder 105 outputs the bit sequences $D5_3$ and the two bit sequences $D1_1$ and $D1_2$ of the input data D101 (i.e., $D5_1$ $_{and\ D52}$), thus performing convolutional coding with code rate 2/3.

In the encoding device 102, the two bit sequences $D5_1$ and $D5_2$ of the resulting three bit sequences $D5_1$ to $D5_3$ are input to the IIR-code side of the convolutional encoder 107 via the interleaver 106, and the minimum Hamming distance between the two bit sequences $D5_1$ and $D5_2$ is set to 2. This also contributes to the occurrence of the waterfall phenomenon in a region with low signal-to-noise power ratio $E_b/N_o$. It is known as the empirical rule in the art that the minimum Hamming distance is set to 2 or more, particularly, the minimum Hamming distance is set to 2, in order to reduce the signal-to-noise power ratio $E_b/N_o$ at which the waterfall phenomenon is exhibited. This empirical rule can also apply in this embodiment.

Figure 20:
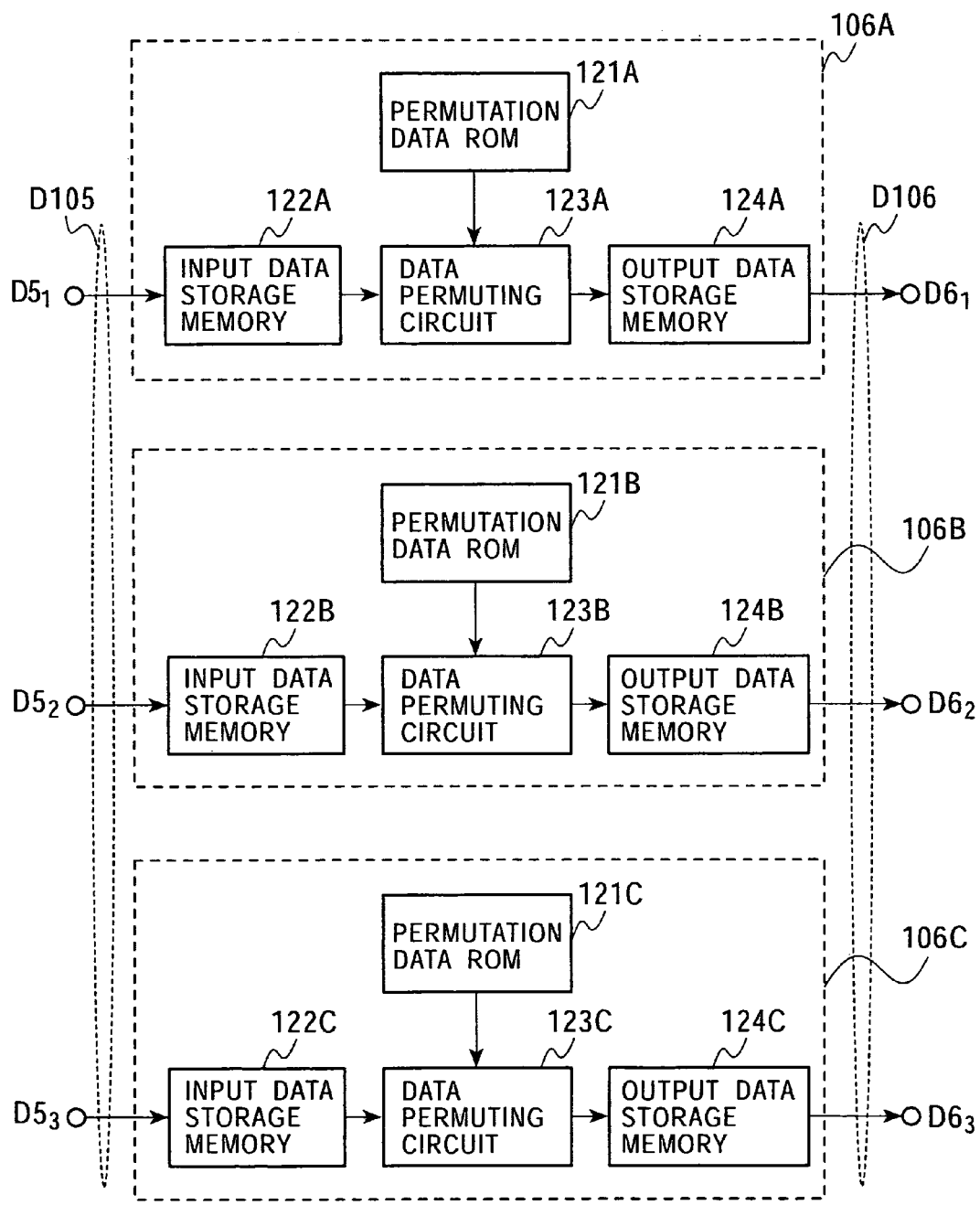
FIG. 20 is a block diagram of an interleaver 106 shown in FIG. 15.

FIG. 20 is a block diagram of the interleaver 106. In the interleaver 106, interleavers 106A to 106C are provided for the three bit sequences $D5_1$ to $D5_3$ output from the convolutional encoder 105, respectively, and individually interleave the respective sequences so that the sequences for the IIR codes in the convolutional encoder 107 are not mixed with the remaining sequences. The interleavers 106A to 106C have the same structure, except that different permutation position information is recorded in permutation data ROMs 121A to 121C, as desired. Thus, the interleaver 106A will be described, while the components of the interleavers 106B and 106C are given the corresponding reference numerals and a description thereof is omitted. The permutation position information recorded in the permutation data ROMs 121A to 121C has different settings, as desired, so that the interleaver 106 performs permutation so that an identical bit sequence of input data is not output in relation to other bit sequences, wherein all sequences or some of the sequences are permuted in the same order or all sequences are permuted in different orders.

In the interleaver 106A, the corresponding bit sequence $D5_1$ of the output data D105 of the convolutional encoder 105 is temporarily stored in an input data storage memory 122A, and is then input to a subsequent data permuting circuit 123A. The data permuting circuit 123A permutes the order of the output data from the input data storage memory 122A based on the data permutation position information recorded in the permutation data ROM 121A, and outputs the result. The output data of the data permuting circuit 123A is temporarily stored in a subsequent output data storage memory 124A, and is then output. The series of data transfer from the input data storage memory 122A to the data permuting circuit 123A, data permutation of the data permuting circuit 123A, and data transfer from the data permuting circuit 123A to the output data storage memory 124A is performed in units of predetermined amount of data.

Figure 21:
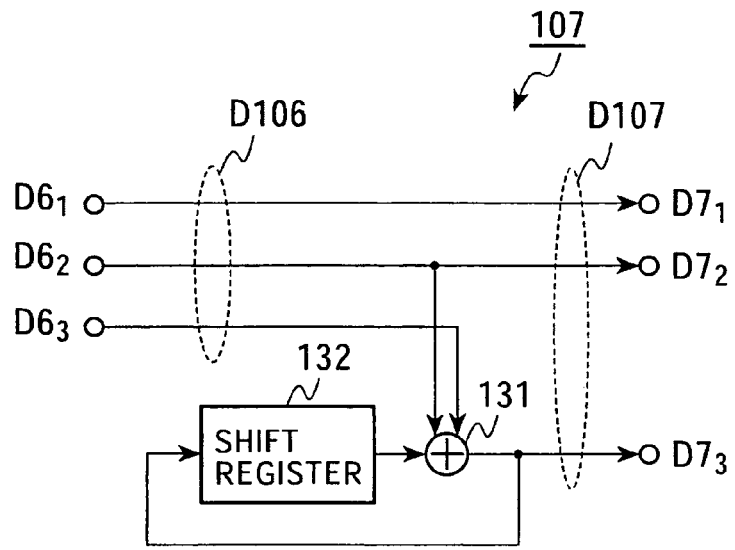
FIG. 21 is a block diagram of a convolutional encoder 107 shown in FIG. 15.

FIG. 21 is a block diagram of the convolutional encoder 107. In the convolutional encoder 107, out of three bit sequences $D6_1$ to $D6_3$ constituting the output data D106 of the interleaver 106, two bit sequences $D6_2$ and $D6_3$ that are assigned to the IIR codes are input to an exclusive OR circuit 131 to determine the exclusive OR of the input bit sequences and the output data of a shift register 132, and the resulting exclusive OR is fed back to the shift register 132. The convolutional encoder 107 outputs to the subsequent multi-level modulation mapping circuit 108 the bit sequence $D6_1$ (i.e., $D7_1$), of the three bit sequences $D6_1$ to $D6_3$, which is not assigned to the IIR codes, the sequence $D6_2$ (i.e., $D7_2$) of the two bit sequences $D6_2$ and $D6_3$ assigned to the IIR codes, and the exclusive ORed bit sequence $D7_3$. Therefore, the convolutional encoder 107 outputs the bit sequence $D6_1$ that is not coded, and the remaining two sequences that are coded as the IIR codes, thus performing convolutional coding with code rate 3/3.

The multi-level modulation mapping circuit 108 maps the coded data D107 output from the convolutional encoder 107 onto a transmission symbol in, for example, 8PSK modulation. In this case, the multi-level modulation mapping circuit 108 maps the 3-bit encoded data $D7_1$ to $D7_3$ output from the convolutional encoder 107 onto a transmission symbol to generate a single coded transmission symbol.

Accordingly, finally, the encoding device 102 encodes the input data D101 with code rate 2/3, while meeting the requirements described above of the interleaver 106 and the inner-code convolutional encoder 107, and transmits the resulting data D107 to the receiver via the noisy memoryless channel 103.

In the processing, the multi-level modulation mapping circuit 108 maps n bits of the n bit sequences of data, which are output at one time, onto one transmission symbol in $2^n$-level modulation, namely, 8PSK modulation. This also improves the error rate.

Figure 22:
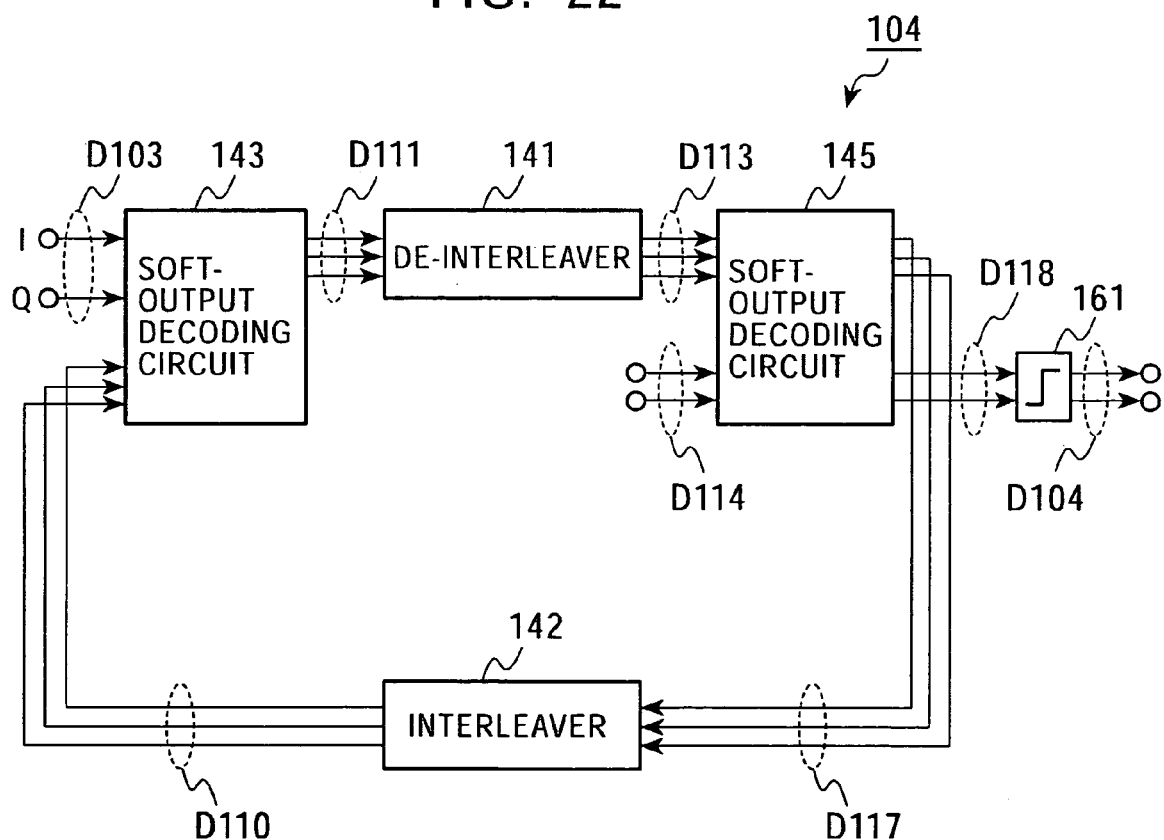
FIG. 22 is a block diagram of a decoding device in the data transmitting and receiving system shown in FIG. 14.

FIG. 22 is a block diagram of the decoding device 104 in the receiver. The decoding device 104 includes soft-output decoding circuits 143 and 145 that decode an inner code and an outer code, respectively, which are connected via a de-interleaver 141 and an interleaver 142. In the decoding device 104, the data D103 from the memoryless channel 103 is input, as I-output Q-output soft-input in 8PSK modulation, to the soft-output decoding circuit 143 that decodes an inner code.

Figure 23:
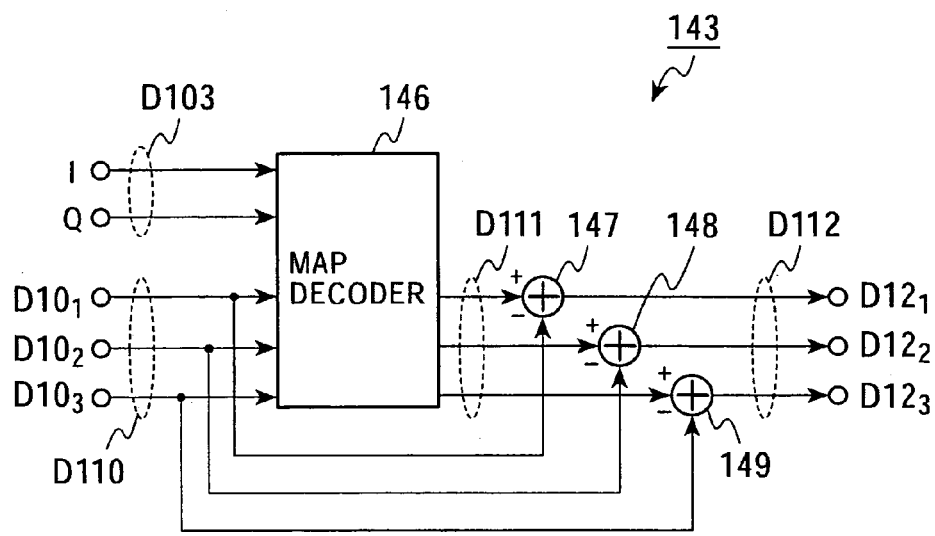
FIG. 23 is a block diagram of a soft-output decoding circuit 143 of the decoding device shown in FIG. 22.

The soft-output decoding circuit 143 corresponds to the convolutional encoder 107 of the encoding device 102. As shown in FIG. 23, a MAP decoder 146 performs maximum a-posteriori probability decoding based on the BCJR algorithm, and the decoded results are processed by subtractors 147 to 149. Upon receiving the soft-input received word D103 and three-sequence a-priori probability information D110 (i.e., $D10_1$ to $D10_3$) from the interleaver 142, which corresponds to the input data D106 of the convolutional encoder 107, the MAP decoder 146 performs MAP decoding based on the BCJR algorithm to generate a-posteriori probability information D111 corresponding to the a-priori probability information D110. In the soft-output decoding circuit 143, the subtractors 147 to 149 determine difference values D112 (i.e., $D12_1$ to $D12_3$) between the a-posteriori probability information D111 and the corresponding a-priori probability information D110. The soft-output decoding circuit 143 outputs the difference values D112 (i.e., $D12_1$ to $D12_3$) to the subsequent de-interleaver 141 as extrinsic information corresponding to the information bits of the received word D103.

More specifically, let u be an information bit, c be a coded bit, and y be the received word D103. The a-priori probability information D110 (L(u)) given by the equation below is input to the MAP decoder 146 in the soft-output decoding circuit 143:

$$L(u) = \log \frac{P(u=1)}{P(u=0)} \quad (3)$$

where P(u=1) denotes the probability of the information bit u being 1, and P(u=0) denotes the probability of the information bit u being 0. Thus, the a-priori probability information D110 (L(u)) that is expressed in terms of a natural logarithm and that is free from the code constraint condition, and the received word D103 are input to the MAP decoder 146.

Based on the a-priori probability information D110 (L(u)) and the received word D103, the MAP decoder 146 generates the a-posteriori probability information D111 (L*(u)) given by the following equation:

$$L^*(u) = \log \frac{P(u=1 \mid y)}{P(u=0 \mid y)} \quad (4)$$

where P(u=1|y) denotes the probability of the information bit u being "1" when the received word D103 (y) is received, and P(u=0|y) denotes the probability of the information bit u being "0" when the received word D103 (y) is received.

Thus, the soft-output decoding circuit 143 generates the a-posteriori probability information D111 (L*(u)) that is expressed in terms of a natural logarithm and that complies the code constraint condition, as given by the equation below. The a-posteriori probability information D111 (L*(u)) is also referred to as the log likelihood ratio, indicating the likelihood of the information bit u when the received word D103 (y) is received. Therefore, the soft-output decoding circuit 143 determines the difference values using the subtractors 147 to 149, and outputs the extrinsic information D112 ($L_e$(u)) given by the following equation to the de-interleaver 141:

$$L_e(u) = L^*(u) - L(u) \quad (5)$$

The de-interleaver 141 is configured so as to correspond to the interleaver 106 of the encoding device 102. The de-interleaver 141 de-interleaves the soft-output extrinsic information D112 based on the reverse input/output characteristics to the input/output characteristics of the interleaver 106, and outputs soft-output extrinsic information D113 corresponding to the input data D105 of the interleaver 106 in the encoding device 102.

Figure 24:
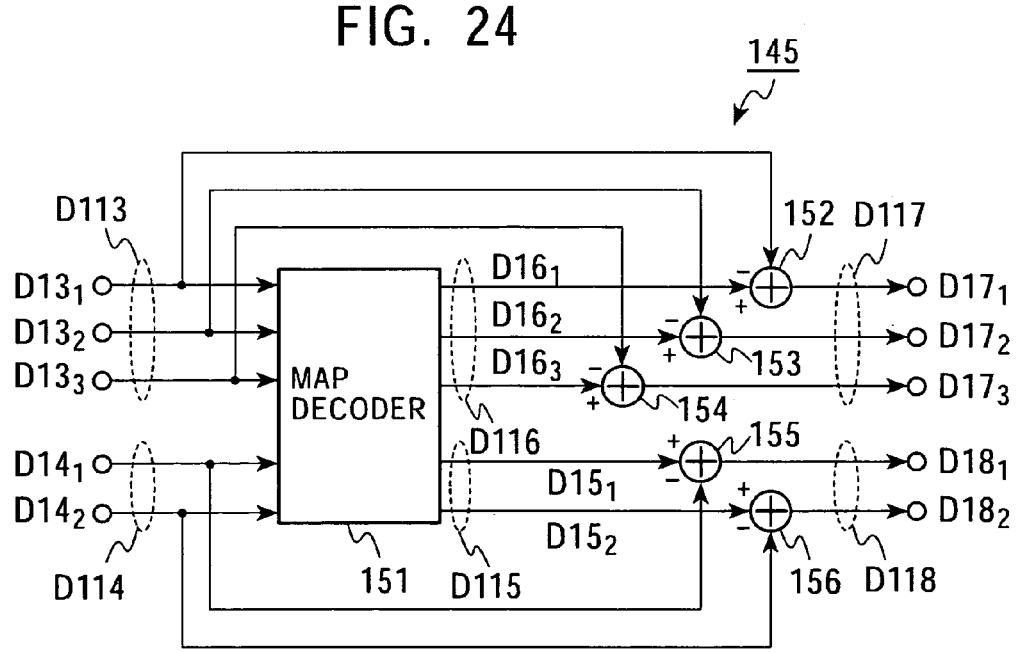
FIG. 24 is a block diagram of a soft-output decoding circuit 145 of the decoding device shown in FIG. 22.

The soft-output decoding circuit 145 is configured so as to correspond to the convolutional encoder 105 of the encoding device 102. As shown in FIG. 24, in the soft-output decoding circuit 145, the soft-input a-priori probability information D113 output from the de-interleaver 141 is input to a MAP decoder 151. The MAP decoder 151 further receives a-priori probability information D114 ($D14_1$ and $D14_2$) of two soft values that correspond to the information bits of value 0. The MAP decoder 151 performs MAP decoding based on the BCJR algorithm to generate a-posteriori probability information D115 (i.e., $D15_1$ and $D15_2$) that corresponds to the information bits of value 0, and a-posteriori probability information D116 (i.e., $D16_1$ to $D16_3$) that corresponds to the a-priori probability information D113 (i.e., $D13_1$ to $D13_3$).

In the soft-output decoding circuit 145, the a-posteriori probability information D116 (i.e., $D16_1$ to $D16_3$) that corresponds to the a-priori probability information D113 (i.e., $D13_1$ to $D13_3$) is input to subtractors 152 to 154 to determine the difference values between the a-posteriori probability information D116 (i.e., $D16_1$ to $D16_3$) and the corresponding a-priori probability information D113 (i.e., $D13_1$ to $D13_3$). Thus, the soft-output decoding circuit 145 obtains soft-value extrinsic information D117 (i.e., $D17_1$ to $D17_3$) that corresponds to the a-priori probability information D113 (i.e., $D13_1$ to $D13_3$), and outputs it to the interleaver 142.

The interleaver 142 (see FIG. 22) interleaves the soft-input extrinsic information D117 output from the soft-output decoding circuit 145 in the same manner as in the interleaver 106 of the encoding device 102 to generate the a-priori probability information D110, and outputs the a-priori probability information D110 to the soft-output decoding circuit 143.

In the soft-output decoding circuit 145, the a-posteriori probability information D115 (i.e., $D15_1$ and $D15_2$) that corresponds to the information bit of value 0 is also input to subtractors 155 and 156 to determine the subtracted value between the a-posteriori probability information D115 (i.e., $D15_1$ and $D15_2$) and the corresponding a-priori probability information D114 (i.e., $D14_1$ and $D14_2$). Thus, extrinsic information D118 (i.e., $D18_1$ and $D18_2$) of two soft values is output.

More specifically, let u be an information bit and c be a coded bit. The a-priori probability information D114 (L(u)) and D113 (L(c)) given by the equations below, respectively, is input to the MAP decoder 151 in the soft-output decoding circuit 145:

$$L(u) = \log\frac{P(u=1)}{P(u=0)} \quad (6)$$

$$L(c) = \log\frac{P(c=1)}{P(c=0)} \quad (7)$$

where P(u=1) denotes the probability of the information bit u being 1, P(u=0) denotes the probability of the information bit u being 1, P(c=1) denotes the probability of the coded bit c being 1, and P(c=0) denotes the probability of the coded bit c being 0.

Thus, the a-priori probability information D114 (L(u)) that is expressed in terms of a natural logarithm and that complies with the code constraint condition, and the a-priori probability information D113 (L(c)) that is expressed in terms of a natural logarithm and that complies with the code constraint condition are input to the MAP decoder 151. In Equations (6) and (7), the code constraint condition in the right side is omitted. The a-priori probability information $D14_1$ (L(u)) is "0" because the probability of the information bit u being "0" or "1" is ½.

Based on the a-priori probability information D114 (L(u)) and D113 (L(c)), the MAP decoder 151 generates the a-posteriori probability information D115 (L*(u)) and D116 (L*(c)) given by the following equations, respectively:

$$L^*(u) = \log\frac{P(u=1)}{P(u=0)} \quad (8)$$

$$L^*(c) = \log\frac{P(c=1)}{P(c=0)} \quad (9)$$

Thus, the soft-output decoding circuit 145 generates the a-posteriori probability information D115 (L*(u)) and D116 (L*(c)) that is expressed in terms of a natural logarithm and that complies with the code constraint condition. The a-posteriori probability information D115 (L*(u)) and D116 (L*(c)) is also referred to as the log likelihood ratio, indicating the likelihood of the information bit u and the coded bit c, respectively. In Equations (8) and (9), the code constraint condition in the right side is omitted.

Therefore, the soft-output decoding circuit 145 determines the extrinsic information D118 ($L_e$(u)) and D117 ($L_e$(c)) given by the equations below based on the difference values determined by the subtractors 152 to 156, and outputs the results to the interleaver 142 and a binarizing circuit 161 (see FIG. 22):

$$L_e(u) = L^*(u) - L(u) \quad (10)$$

$$L_e(c) = L^*(c) - L(c) \quad (11)$$

The a-priori probability information D114 that corresponds to the information bit u is "0", and therefore the subtractors 155 and 156 may be removed in the soft-output decoding circuit 145.

With the structure described above, upon receiving the received word D103, the decoding device 104 iterates the decoding processing of the soft-output decoding circuit 143 to the soft-output decoding circuit 145 a predetermined number of times (for example, several times to tens of times), and the resulting soft-output extrinsic information D118 is processed by the binarizing circuit 161. The binarizing circuit 161 binarizes the soft-output extrinsic information D118 output from the soft-output decoding circuit 145, and outputs hard-output decoded data D104. Accordingly, in the decoding device 104, the soft-output decoding circuits 143 and 145 corresponding to the convolutional coders 107 and 105 of the encoding device 102, respectively, iteratively process the received word to separate a high-decoding-complexity code into low-complexity components for processing, thus constantly improving the characteristics due to an interaction between the soft-output decoding circuits 143 and 145.

(1-2) Operation of First Embodiment

In the structure described above, in the data transmitting and receiving system 101 (see FIG. 14), the transmission data D101 is coded and 8PSK modulated by the encoding device 102 in the transmitter, and is then sent via the memoryless channel 103 to the receiver, in which the data D101 is decoded by the decoding device 104.

In the encoding device 102 (see FIG. 15), the data D102 is encoded with code rate 2/3 by the outer-code convolutional encoder 105, which serves as first encoding means, and is then permuted by the interleaver 106. The resulting data is encoded with code rate 3/3 by the inner-code convolutional encoder 107, which serves as second encoding means, and is then mapped by the multi-level modulation mapping circuit 108 onto a transmission symbol, which is then output.

In the data transmitting and receiving system 101, in this second encoding processing, two bit sequences out of three bit sequences are encoded so as to produce an infinite impulse responses, which are then output, and the remaining one sequence is not encoded or is encoded so as to produce a finite impulse response, which is then output. Thus, as shown in FIG. 16, in comparison to FIG. 11, the so-called waterfall phenomenon is exhibited in a lower signal-to-noise power ratio ($E_b/N_o$) than that in the related art, leading to improved performance over the related art.

Moreover, the sequences for an infinite impulse response and other sequences are scrambled by the interleaver 106 so as not to be mixed with each other, and the second encoding processing described above is performed. As shown in FIG. 18, in comparison to FIG. 16, the phenomenon (error floor phenomenon) that the error rate drop caused by an increase of the signal-to-noise power ratio ($E_b/N_o$) is retarded midway is suppressed, leading to further improve performance.

Figure 1:
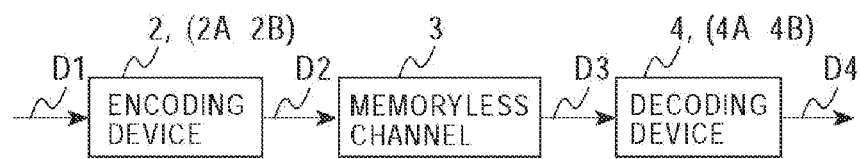
FIG. 1 is a block diagram of an SCCC data transmitting and receiving system of the related art.
Figure 25:
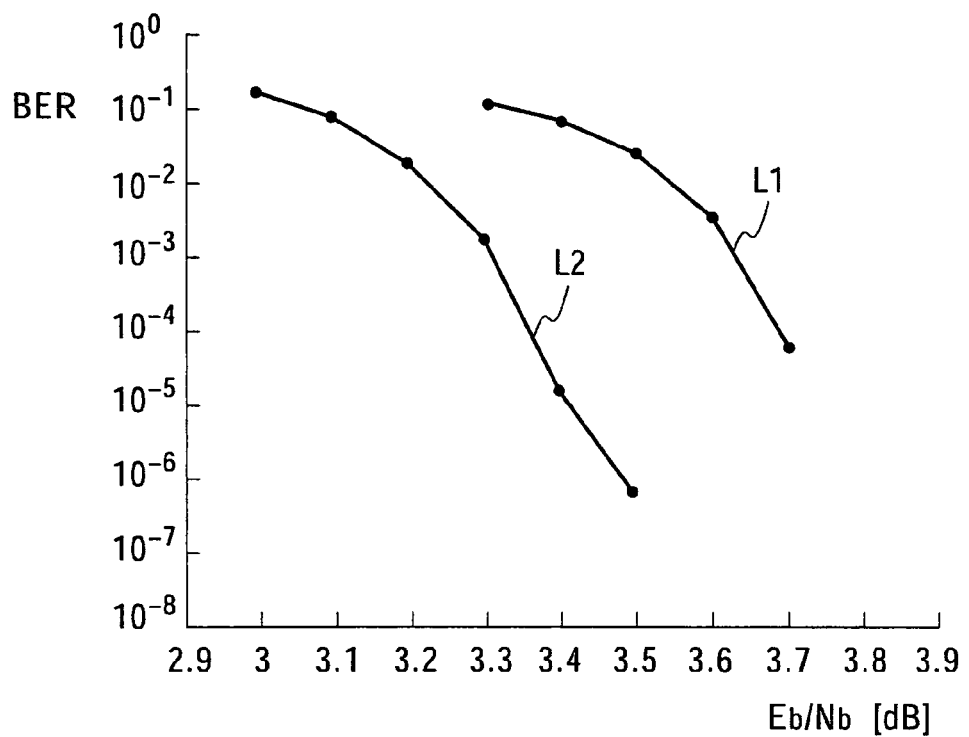
FIG. 25 is a characteristic curve diagram showing the characteristics of the data transmitting and receiving system under the different conditions from those in FIG. 18.
Figure 26:
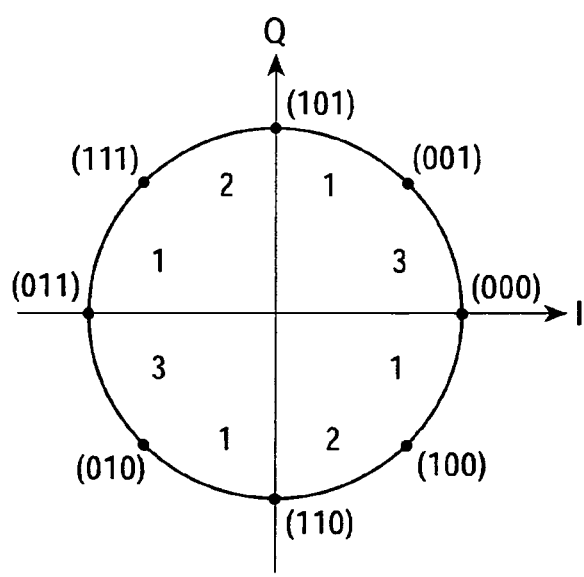
FIG. 26 is a characteristic curve diagram showing a mapping constellation that exhibits the characteristic curve diagram shown in FIG. 25.

FIG. 25 is a characteristic curve diagram showing the performance curve of the data transmitting and receiving system 101. In FIG. 25, L1 indicates the characteristic of the system of the related art shown in FIG. 1, and L2 indicates the characteristic of the system according to this embodiment. The characteristic shown in FIG. 25 is obtained in a case where outer coding and inner coding are carried out with generator matrices $G_o$ and $G_I$ given by the equations below, respectively. In multi-level modulation mapping, signal points are mapped onto the constellation shown in FIG. 26.

$$G_o = \begin{bmatrix} 1 & D & 1+D \\ D+D^2 & 1 & 1+D^2 \end{bmatrix} \quad (12)$$

$$G_I = \begin{bmatrix} 1 & 0 & 0 \\ 0 & 1 & D/(1+D+D^2) \\ 0 & 1 & 1/(1+D+D^2) \end{bmatrix} \quad (13)$$

As can be seen from FIG. 25, the performance is improved even if the generator matrices $G_o$ and $G_I$ change. The wider the permutation range of the interleaver 106, the larger the gradient of the performance curve in the waterfall region, leading to low error floor.

In this example, n bit sequences of data are mapped so that the Hamming distance between the output codewords in which the Euclidean distance between transmission symbols is minimized larger than between other codewords. Thus, the first encoding means outputs p bit sequences of data that is coded so that the minimum distance between output codewords is small. This also contributes to the occurrence of the waterfall phenomenon in a region with low signal-to-noise power ratio ($E_b/N_o$), as in the case described above with reference to FIG. 17.

Moreover, in this embodiment, interleaving and inner coding are performed in the manner described above to carry out coding of the outer code and the inner code with code rates k/(k+1) (k is an arbitrary natural number) and 1, respectively, thus making it possible to maintain the final code rate as high as k/(k+1) using a simple structure.

The decoding device 104 includes the soft-output decoding circuits 143 and 145, which are connected with each other. The data D103 transmitted by the processing of the encoding device 102 is processed and decoded by the soft-output decoding circuits 143 and 145. Thus, high performance is achieved with substantially the same circuit size as that of the related art.

In the encoding device 102 of the basic structure described above, the sequentially input data D101 is encoded by the outer-code convolutional encoder 105 (see FIG. 19). At this time, the output data to be supplied for an infinite impulse response is coded with a minimum Hamming distance of 2. Thus, the two bit sequences of input data D101 can be most efficiently coded, and degradation in the error rate can be sufficiently prevented. The two bit sequences of input data D101 may be coded with a minimum Hamming distance of 2 or more. In this case, degradation in the error rate can also be sufficiently prevented.

In coding with code rates k/p and p/n, k or more bit sequences are supplied for an infinite impulse response, particularly, in this embodiment, in coding with code rate p/n=3/3 (=1), k bit sequences are supplied for an infinite impulse response. Thus, the final code rate is not high, and the error rate is sufficiently improved.

In subsequent interleaving performed by the interleaver 106 (see FIG. 20), the p bit sequences of data are permuted by a plurality of circuit blocks (the interleavers 106A to 106C) each permuting one bit sequence so that the bit sequence for an infinite impulse response is not mixed with other bit sequences, thereby permitting data belonging to the same sequence of input bits to belong to the same sequence of output bits. The permuted data is output to the encoder 107.

In the encoding device 102, depending upon the features, etc., of transmission data, the settings of the permutation order for the interleavers 106A to 106C, which are stored in the permutation data ROMs 121A to 121C, can be modified, and the system configuration can be flexibly changed. That is, the settings are determined so that data belonging to the same sequence of input bits belongs to the same sequence of output bits, and the data is permuted in different orders from one sequence to another, or is permuted in the same order across all sequences or across some of the sequences; otherwise, the data is permuted in a random order across the respective sequences, thereby achieving appropriate system configuration.

The subsequent inner-code convolutional encoder 107 (see FIG. 21) outputs the two bit sequences that are coded so as to produce an infinite impulse response and the remaining one bit sequence that is not coded. These bit sequences are then mapped by the multi-level modulation mapping circuit 108 onto a transmission symbol, and the result is output.

In the series of operations, in this embodiment, the sequences are mapped so that the Hamming distance between the output codewords in which the Euclidean distance between transmission symbols is minimized is smaller than between other codewords, and, in outer coding, data that is coded so that the minimum distance between the output codewords is large is output. Alternatively, n bit sequences of data are mapped so that the Hamming distance between the output codewords in which the Euclidean distance between transmission symbols is minimized is larger than between other codewords, and, in outer coding, data that is coded so that the minimum distance between the output codewords is small is output. This also permits the waterfall phenomenon to be exhibited in a region with low signal-to-noise power ratio ($E_b/N_o$), leading to improvement in the performance.

(1-3) Advantages of First Embodiment

With the structure described above, in second encoding, which is inner coding, a sequence that is not encoded or that is encoded so as to produce a finite impulse response and a sequence that is encoded so as to produce an infinite impulse response are output, and, in interleaving before the second encoding, the sequences are permuted so as not to be mixed with each other. Thus, an SCTCM encoding device and encoding method with improved performance over the related art are achieved.

Moreover, the resulting n bit sequences of data are mapped onto a transmission symbol, thus achieving an SCTCM encoding device and encoding method with improved performance over the related art.

Moreover, correspondingly to such encoding, decoding is performed using soft-output decoding circuits, a de-interleaver, and an interleaver, thus achieving a decoding device and decoding method with improved performance over the related art.

The bit sequence that is supplied to the infinite impulse response side of the second encoding means is output with a minimum Hamming distance of 2 or more. Alternatively, the bit sequence that is supplied to the infinite impulse response side of the second encoding means is output with a minimum Hamming distance of 2. Thus, the overall data can be most efficiently coded, and degradation in the error rate can be sufficiently prevented.

(2) Second Embodiment

Figure 27:
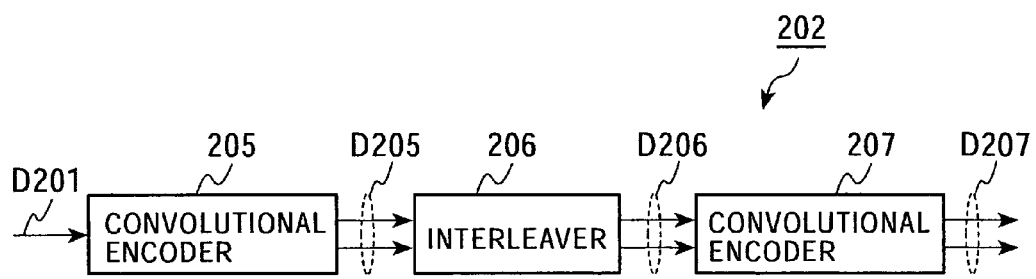
FIG. 27 is a block diagram of an encoding device in a data transmitting and receiving system according to a second embodiment of the present invention.

FIG. 27 is a block diagram of an encoding device in a data transmitting and receiving system according to a second embodiment of the present invention. In the data transmitting and receiving system, an encoding device 202 performs serial concatenated convolutional coding on digital information D201 according to the SCOC scheme, and transmits the coded output D207 to a receiver via a noisy memoryless channel, and then a decoding device in the receiver decodes the transmitted output.

In the encoding device 202, the digital information D101 is convolutional coded with code rate k/p by an outer-code convolutional encoder 205, which serves as first encoding means, and the output data D205 is then interleaved by an interleaver 206. The resulting data is further convolutional coded with code rate p/n by an inner-code convolutional encoder 207, which serves as second encoding means, and is then output to the memoryless channel. Thus, finally, the encoding device 202 performs serial concatenated convolutional coding with code rate k/n to generate n bit sequences of coded data. In this embodiment, k, p, n are set to 1, 2, and 2, respectively.

In this processing, in the encoding device 202, the inner-code convolutional encoder 207 does not perform convolutional coding on at least one of p bit sequences of input data D206; instead, it uses this bit sequence as FIR codes, while using the remaining sequences as IIR codes for recursive systematic convolutional coding.

Figure 28:
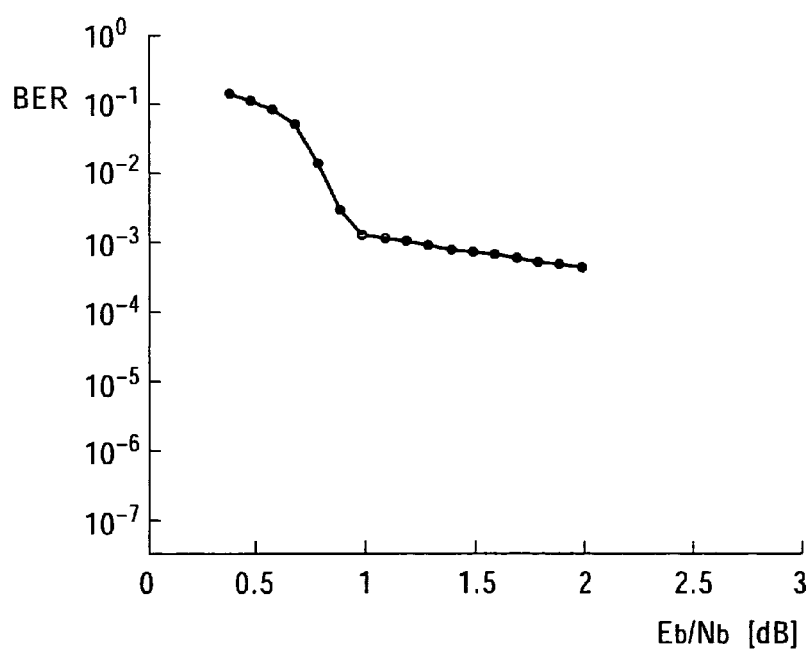
FIG. 28 is a characteristic curve diagram for showing the characteristics of the data transmitting and receiving system using the encoding device shown in FIG. 27.

Thus, as indicated by the performance curve shown in FIG. 28, which represents the relationship between the signal-to-noise power ratio ($E_b/N_o$) per bit and the bit error rate, the encoding device 202 exhibits the so-called waterfall phenomenon in a region with lower signal-to-noise power ratio ($E_b/N_o$) than that in the related art.

Figure 2:
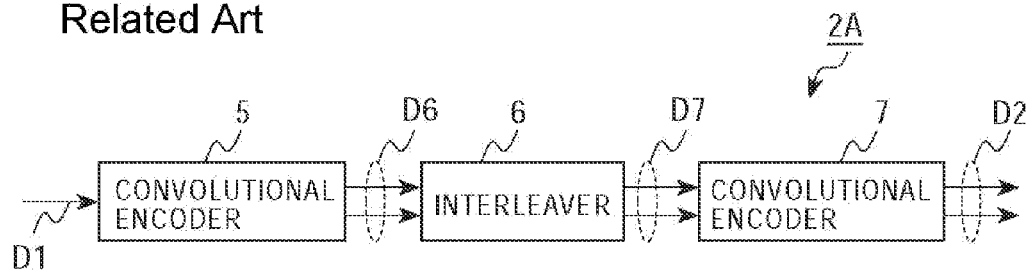
FIG. 2 is a block diagram of an encoding device in the data transmitting and receiving system shown in FIG. 1.

The characteristic shown in FIG. 28 is obtained in a case where the interleaver 6 described above with reference to FIG. 2 is employed rather than the interleaver 206, and outer coding and inner coding are carried out with generator matrices $G_o$ and $G_I$ given by the following equations:

$$G_o = \lfloor 1 \quad (1+D^2)/(1+D+D^2) \rfloor \quad (14)$$

$$G_I = \begin{bmatrix} 1 & 0 \\ 0 & 1/1+D+D^2 \end{bmatrix} \quad (15)$$

As can be seen from the performance curve shown in FIG. 28, the waterfall phenomenon is exhibited in a region with low signal-to-noise power ratio ($E_b/N_o$); however, the gradient of the characteristic curve changes at a bit error rate of about $10^{-3}$, exhibiting the error floor phenomenon.

In view of this, the interleaver 206 of the encoding device 202 interleaves the bit sequences so that the bit sequences for the IIR codes in the convolutional encoder 207 are not mixed with the remaining sequences in order to suppress the occurrence of the error floor.

In this embodiment, it is believed that the error floor occurs because the probability of all weights of the outer interleaved code not being encoded in inner coding, that is, in this example, the probability of all weights of the outer code whose minimum weight is "5" being output as is without any convolutional operation of the convolutional encoder 207, is $(1/3)^5$.

Figure 29:
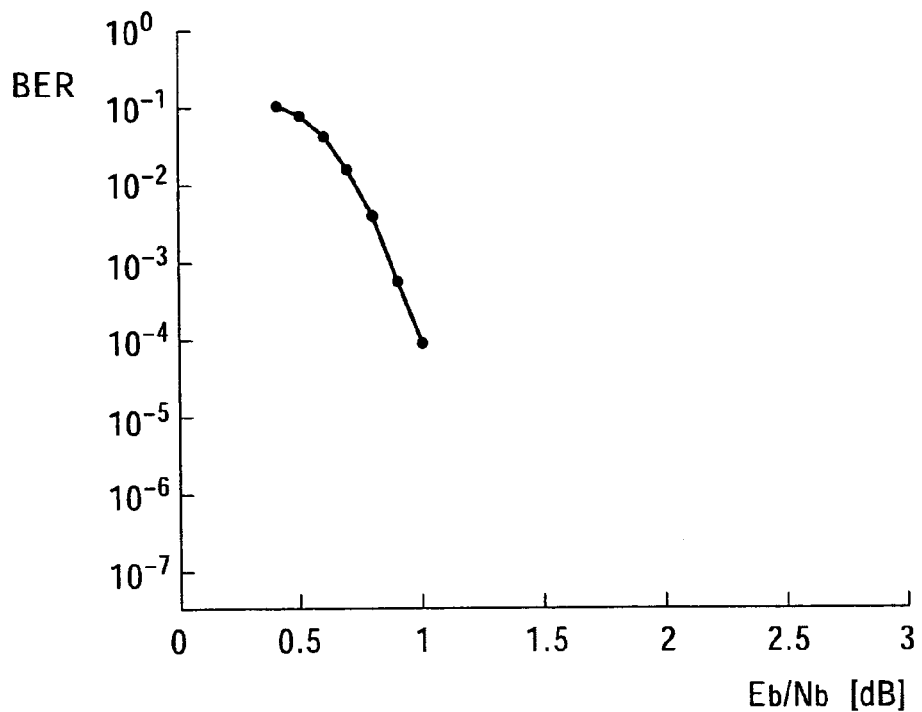
FIG. 29 is a characteristic curve diagram showing the characteristics of the data transmitting and receiving system using the encoding device shown in FIG. 27.

Thus, if all weights of the outer code are not input as the FIR codes to the convolutional encoder 207, it is believed that the occurrence of the error floor is suppressed. In this case, the interleaver 206 may have a variety of configurations in which, for example, bits of data are individually interleaved, bits of data are interleaved separately from the FIR codes, and so forth. If two bit sequences of input data are individually interleaved, as is shown in FIG. 29, compared to FIG. 28, the occurrence of the error floor can be suppressed.

As can be seen from this performance curve, the waterfall phenomenon is exhibited in a region with low signal-to-noise power ratio $E_b/N_o$ compared to the related art, and no error floor occurs even at a high bit error rate, leading to improved performance over the related art.

Figure 3:
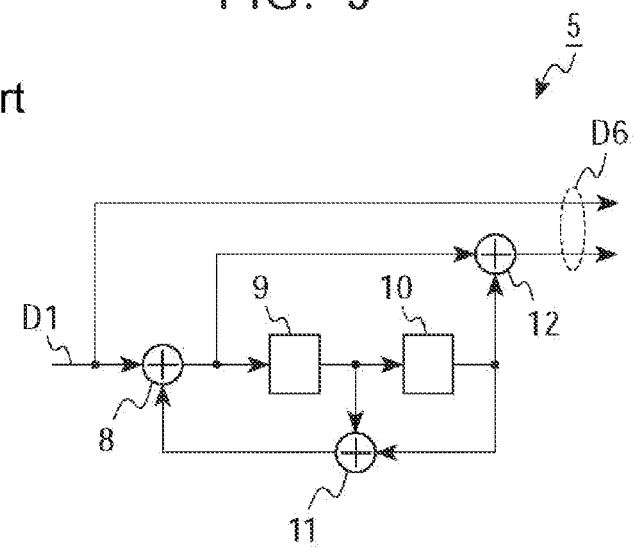
FIG. 3 is a block diagram of a convolutional encoder 5 of the encoding device shown in FIG. 2.
Figure 4:
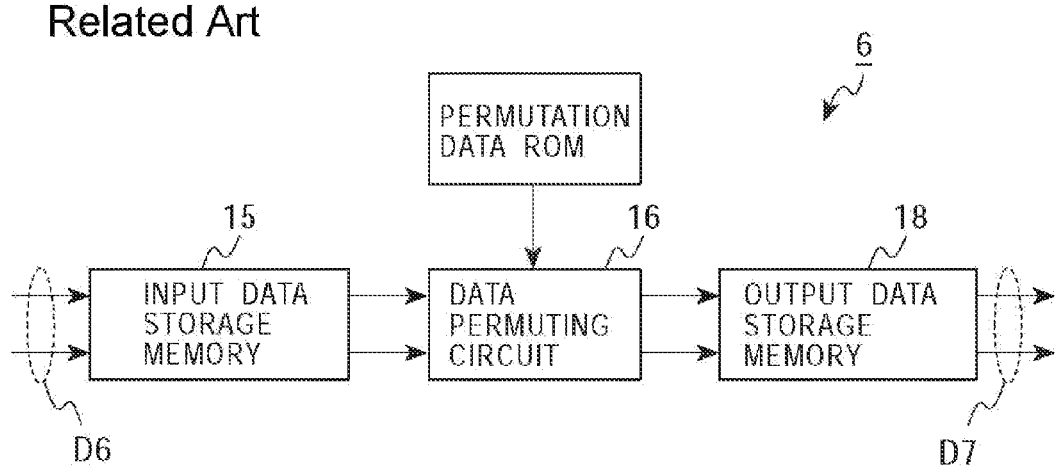
FIG. 4 is a block diagram of an interleaver 6 of the encoding device shown in FIG. 2.
Figure 5:
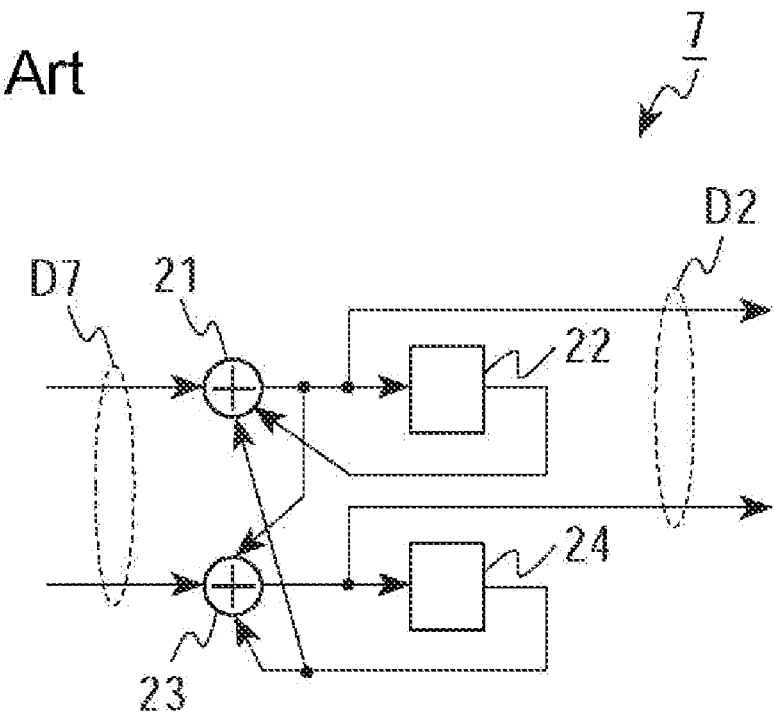
FIG. 5 is a block diagram of a convolutional encoder 7 of the encoding device shown in FIG. 2.

More specifically, the outer-code convolutional encoder 205 of the encoding device 202 may be implemented by the convolutional encoder 5 described above with reference to FIG. 3. The interleaver 206 may be configured in a similar manner to that of the structure described above with reference to FIG. 20, that is, an interleaver is assigned to each sequence.

Figure 30:
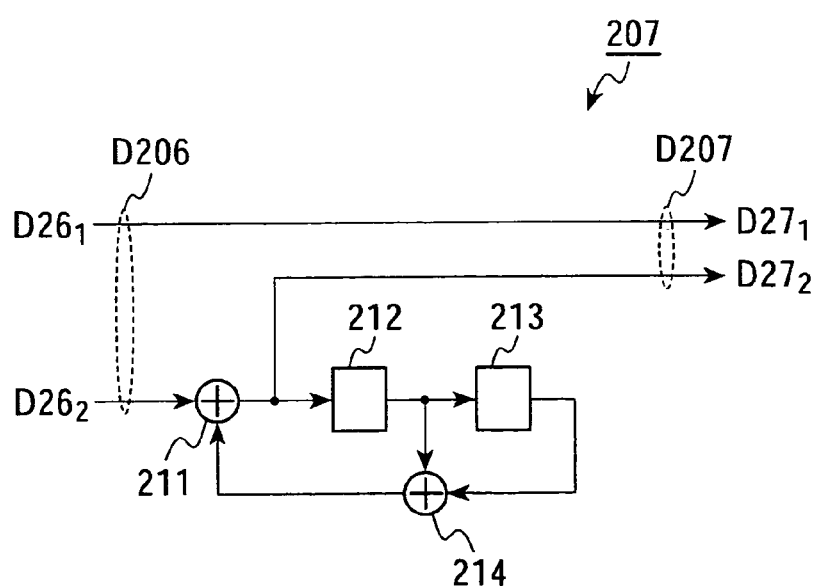
FIG. 30 is a block diagram of a convolutional encoder 207 of the encoding device shown in FIG. 27.

On the other hand, the inner-code convolutional encoder 207 has a structure shown in FIG. 30. In the convolutional encoder 207, one sequence $D26_2$ of the input data D206 is input to a series circuit of an exclusive OR circuit 211 and shift registers 212 and 213, and the output data of the shift registers 212 and 213 are exclusive ORed by an exclusive OR circuit 214. The resulting exclusive OR is then input to the exclusive OR circuit 211. The convolutional encoder 207 outputs the another sequence $D26_1$ of the input data D206 and the output data of the exclusive OR circuit 211. In this way, the input data D206 is convolutional coded with code rate 2/2, and two bit sequences of output data D207 are output.

In the convolutional encoder 207, therefore, the bit sequence $D26_1$ is output as is without any convolutional coding, while the remaining bit sequence $D26_2$ is used as FIR codes for recursive systematic convolutional coding.

Figure 6:
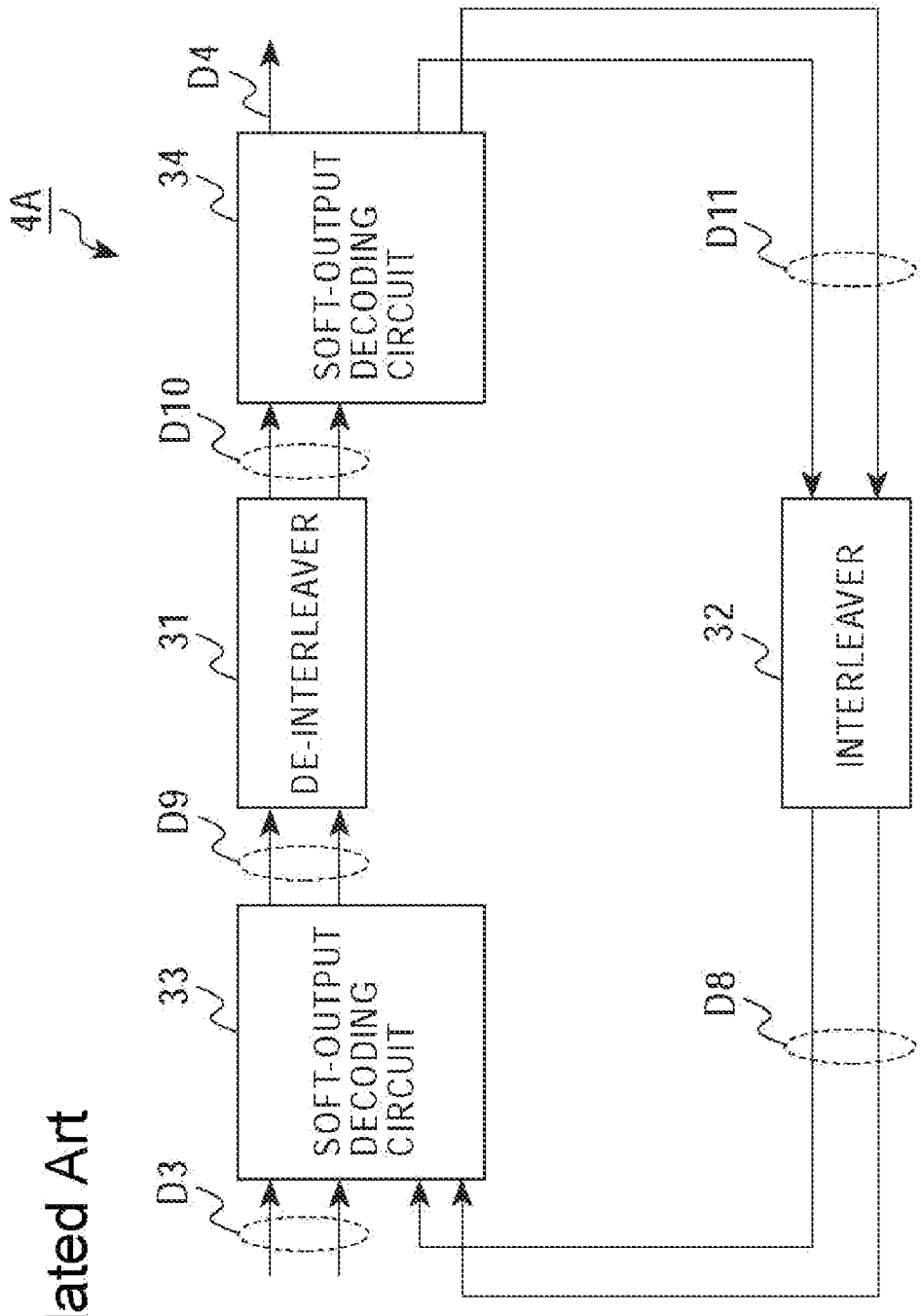
FIG. 6 is a block diagram of a decoding device in the data transmitting and receiving system shown in FIG. 1.

The decoding device has the same structure as that of the decoding device 4A described above with reference to FIG. 6, except that this decoding device includes a soft-output decoding circuit 33, a de-interleaver 31, a soft-output decoding circuit 34, and an interleaver 32, which correspond to the convolutional encoders and the interleavers of the encoding device 202.

Figure 31:
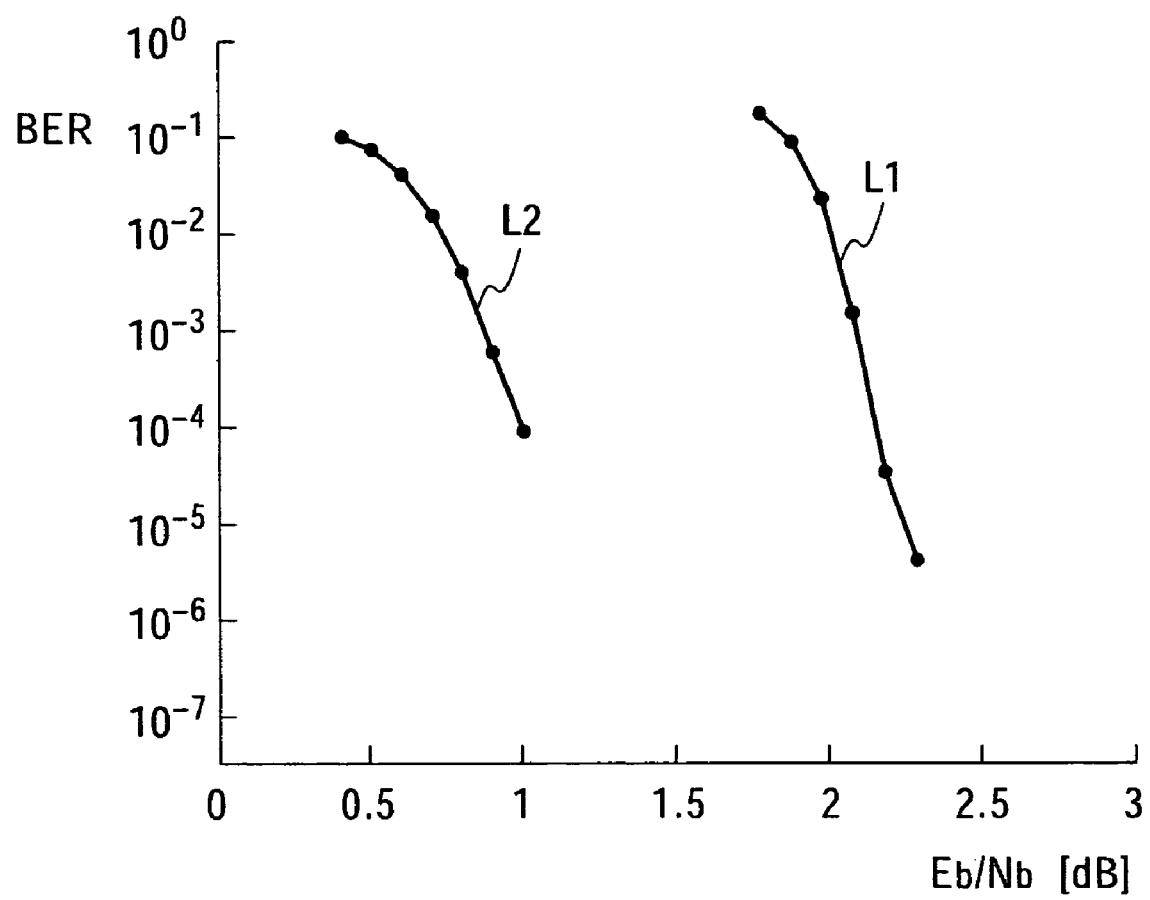
FIG. 31 is a characteristic curve diagram showing the characteristics of the data transmitting and receiving system using the encoding device shown in FIG. 27.

FIG. 31 is a characteristic curve diagram showing the performance curve of the data transmitting and receiving system according to this embodiment. In FIG. 31, L1 indicates the characteristic of the system of the related art shown in FIG. 1, and L2 indicates the characteristic of the system according to this embodiment. The characteristic shown in FIG. 31 is obtained in a case where outer coding and inner coding are carried out with the generator matrices $G_o$ and $G_I$ given by Equations (14) and (15), respectively. According to this embodiment, as can be seen from FIG. 31, the performance is improved.

According to the second embodiment, similar advantages to those of the first embodiment are achieved when outer coding and inner coding are carried out with code rates 1/2 and 2/2, respectively.

(3) Other Embodiments

In the foregoing embodiments, the inner-code convolutional encoder does not perform coding; however, the present invention is not limited thereto. Instead, the inner-code convolutional encoder may perform coding so as to produce a finite impulse response. In this case, convolutional encoders 257 and 287 shown in, for example, FIGS. 32 and 33, etc., may be used as example convolutional encoders, in place of the convolutional encoder 107 described above with reference to FIG. 21.

Figure 32:
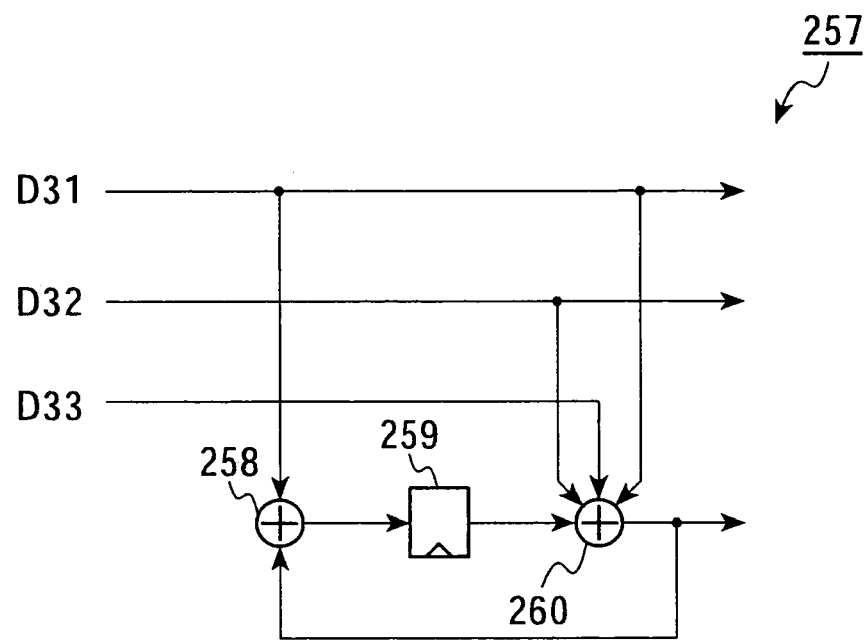
FIG. 32 is a block diagram of an inner coder according to another embodiment.

In the convolutional encoder 257 shown in FIG. 32, a first bit sequence D31 is input to a series circuit of an exclusive OR circuit 258, a shift register 259, and an exclusive OR circuit 260. In the convolutional encoder 257, the exclusive OR of the output data of the shift register 259 and the first to third bit sequences D31 to D33 is determined by the exclusive OR circuit 260 at the last stage, and the resulting exclusive OR is fed back to the exclusive OR circuit 258 at the first stage to determine the exclusive OR between this exclusive OR and the first bit sequence D31. As a result of coding, the convolutional encoder 257 outputs the first bit sequence D31, the second bit sequence D32, and the output of the exclusive OR circuit 260 at the last stage.

Figure 33:
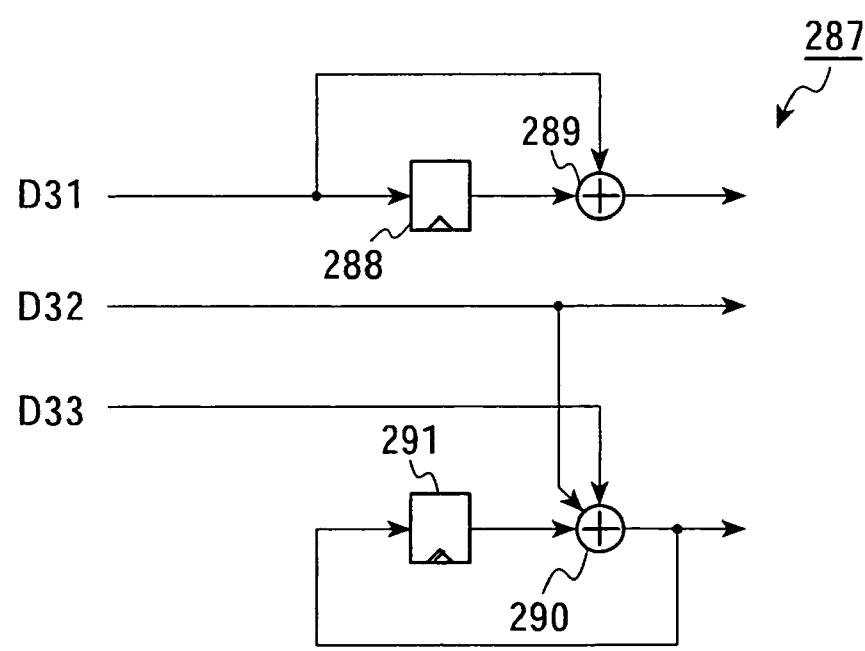
FIG. 33 is a block diagram of another inner coder according to still another embodiment, which is different from that shown in FIG. 32.

On the other hand, in the convolutional encoder 287 shown in FIG. 33, a first bit sequence D31 is input to a series circuit of a shift register 288 and an exclusive OR circuit 289, and the exclusive OR of the input data of the shift register 288 and the output data of the shift register 288 is determined by the exclusive OR circuit 289. Second and third bit sequences D32 and D33 are further input to an exclusive OR circuit 290, and the output data of the exclusive OR circuit 290 is fed back to the exclusive OR circuit 290 via a shift register 291. In the convolutional encoder 287, the exclusive OR of the fed output data of the shift register 291 and the second and third bit sequences D32 and D33 is determined by the exclusive OR circuit 290. As a result of coding, the convolutional encoder 287 outputs the output data of the exclusive OR circuit 289, the second bit sequence D32, and the output data of the exclusive OR circuit 290.

Therefore, similar advantages to those of the embodiments described above are achieved when coding is performed so as to produce a finite impulse response.

In the embodiments described above, an interleaver is provided for each bit sequence. However, the present invention is not limited thereto, and a plurality of sequences may be processed by a single interleaver.

Figure 34:
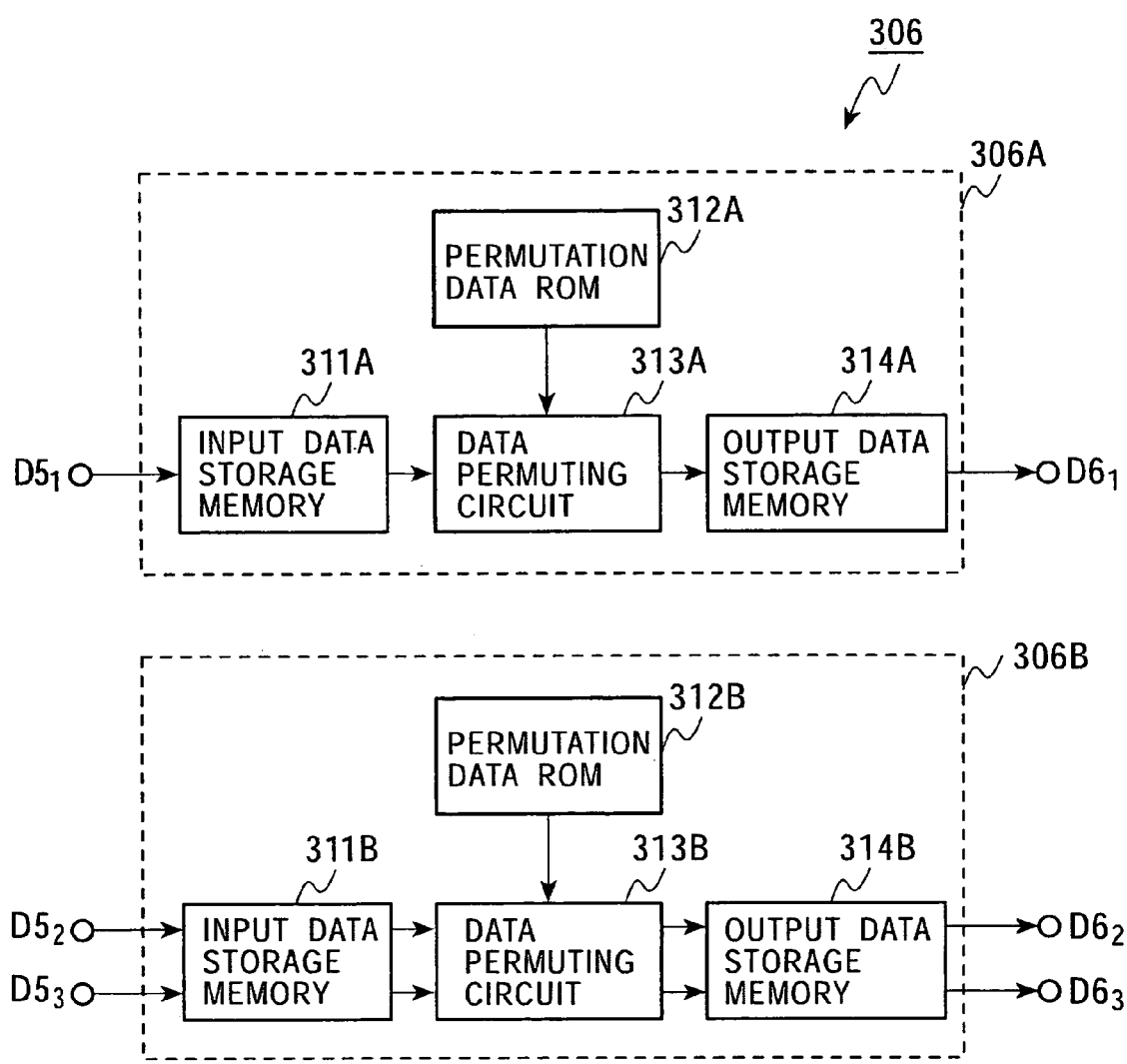
FIG. 34 is a block diagram of another example interleaver.

In an interleaver 306 shown in FIG. 34, an interleaver 306A for processing one sequence and an interleaver 306B for processing two sequences are used to permute three bit sequences $D5_1$ to $D5_3$ to output bit sequences $D6_1$ to $D6_3$. In the interleaver 306A, the bit sequence $D5_1$ is temporarily stored in an input data storage memory 311A, and is then output to a data permuting circuit 313A. The data permuting circuit 313A permutes the input data based on permutation position information recorded in a permutation data ROM 312A, and outputs the result. The output data of the data substitution circuit 313A is temporarily stored in an output data storage memory 314A, and is then output. In the interleaver 306B, the bit sequences $D5_2$ and $D5_3$ are temporarily stored in an input data storage memory 311B, and are then output to a data permuting circuit 313B. The data permuting circuit 313B permutes the input data based on permutation position information stored in a permutation data ROM 312B, and outputs the result. The output data of the data substitution circuit 313B are temporarily stored in an output data storage memory 314B, and are then output.

With this structure, two bit sequences are permuted by the interleaver 306B in the same manner, while sharing the permutation data ROM 312B, thus realizing a simple structure.

Figure 35:
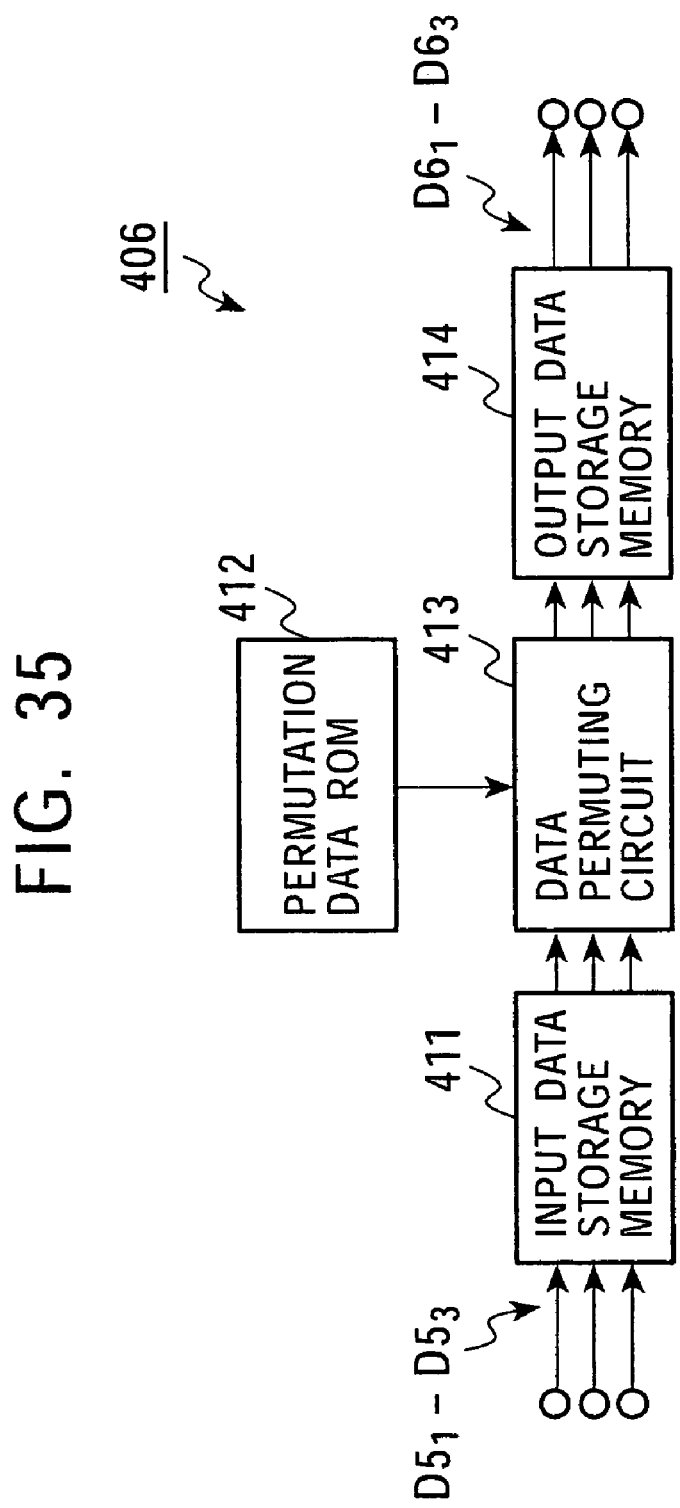
FIG. 35 is a block diagram of still another example interleaver, which is different from that shown in FIG. 34.
Figure 36:
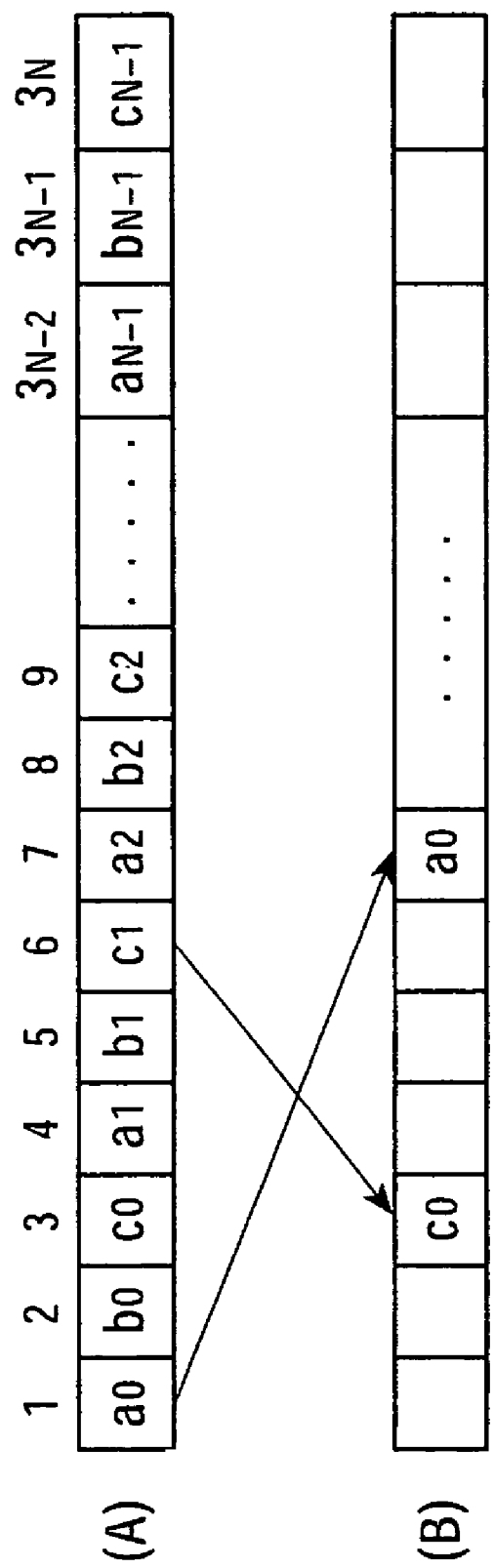
FIG. 36 is a plot for showing interleaving in FIG. 35.

As shown in FIG. 35, an input data storage memory 411, a permutation data ROM 412, a data permuting circuit 413, and an output data storage memory 414 may be formed as a single circuit block. In this case, each of the input data storage memory 411, the data substitution circuit 413, and the output data storage memory 414 may be segmented in units of bit sequences to process each bit sequence. Alternatively, as shown in FIG. 36, consecutive regions may be recursively assigned to bit sequences for processing. In FIG. 36, the bit sequences are indicated by symbols a, b, and c. If consecutive regions are recursively assigned to the bit sequences for processing, as indicated in (A) and (B) showing before and after permutation of the bit sequences in the data permuting circuit 413, respectively, address control is required for permutation of corresponding sequences.

This interleaving may be carried out based on the concept of so-called S-random permutation. That is, in permuting a bit based on the information recorded in the permutation data ROM, if the position number of the destination of the previously S bits permuted is within ±S, the permuted bit may be further permuted to a different destination to ensure a certain distance between the bits. Thus, the resistance to burst noise can be improved. This processing may be performed only on the sequences for an infinite impulse response.

The data that is rearranged so that the input order and the output order in the data sequence may be apart from each other. This also improves the resistance to burst noise.

In the embodiments described above, all bit sequences are permuted; however, the present invention is not limited thereto. A delay circuit merely a for synchronization may be provided for the sequences for a finite impulse response, and such sequences are not necessarily permuted.

In the embodiments described above, the outer-code convolutional encoder includes two-stage shift registers. However, the present invention is not limited thereto, and the number of stages of shift registers may be, for example, one, or three or more to constitute the outer-code convolutional encoder.

In the embodiments described above, the inner-code convolutional encoder includes a stage of shift register; however, the present invention is not limited thereto, and the inner-code convolutional encoder may include two or more stages.

A variety of signal constellations other than the constellation in the embodiments described above may be used.

In the first embodiment, outer coding and inner coding are carried out with code rates k/p=2/3 and p/n=3/3 (=1), respectively. However, the present invention is not limited thereto, and the code rates of outer and inner coding may be modified as desired, e.g., the code rates of outer and inner coding may be set to k/p (k<p) and p/n (p≧n), respectively. If k/p is less than 1, particularly, when p=k+1, the final code rate is not high, and the error rate is sufficiently improved. The value p=(k+a) may be set, and the code rate of outer coding may be set to k/p=ak$_1$/(k$_1$+1) for processing, where a is an integer of 2 or more and k is a multiple of a.

In the embodiments described above, an infinite impulse response is output from the outer-code convolutional encoder with a minimum Hamming distance of 2. However, the present invention is not limited thereto, and the minimum Hamming distance may be, for example, 3 or 4, as long as it is 2 or more.

If the number of sequences for an infinite impulse response is k or more, the output requirement with a minimum Hamming distance of 2 or more is satisfied. If k output bit sequences for a catastrophic code with code rate k/k and a minimum output Hamming distance of 2, and (p−k) bit sequences of the k bit sequences of input data for generating this code are used to form the p bit sequences of data, the output requirement with a minimum Hamming distance of 2 or more can also be satisfied. If a catastrophic code with code rate 1 is used for an infinite impulse response, the requirement described above is also satisfied. Moreover, if the bit sequence for the non-infinite impulse response, which is supplied to the second encoding means via the permuting means, differs by 1 bit, encoding may be performed so that the bit sequence that is encoded so as to produce an infinite impulse response and that is supplied to the second encoding means via the permuting means does not differ by a certain number of bits or more. In this case, the requirement described above is also satisfied.

In the embodiments described above, inner-coding and mapping are performed in a case where the sum of input distances, which serve as the minimum Euclidean distances, is "14". However, the present invention is not limited thereto, and a combination of a code lower than this value and an outer code having a large minimum distance may be used, or a combination of a code higher than the value described above and an outer code having a small minimum distance may be used.

In the embodiments described above, 8PSK modulation is employed as multi-level modulation; however, the present invention is not limited thereto, and a wide variety of other multi-level modulation schemes including quadrature modulation schemes, such as 16-QAM and 64-QAM, may be used.

In the embodiments described above, the soft-output decoding circuit of the decoding device performs MAP decoding based on the BCJR algorithm. However, the present invention is not limited thereto, and a wide variety of soft-output decoding techniques, for example, so-called SOVA (Soft Output Viterbi Algorithm) decoding, may be used.

In the embodiments described above, data is exchanged between a transmitting apparatus and a receiving apparatus; however, the present invention is not limited thereto, and a wide variety of applications to recording and playback of desired data on various recording media, such as optical disks, for example, a floppy disk, a CD-ROM disk, and so on, and magneto-optical disks such as an MO (magneto-optical) disk, may be conceivable.

In the embodiments described above, the encoding device and the decoding device are configured by hardware. However, the present invention is not limited thereto, and a wide variety of applications, for example, a computer shown in, FIG. 37 that implements the encoding device and/or the decoding device, may be conceivable.

In the configuration of a computer 450 shown in FIG. 37, like a standard computer, a hard disk drive (HDD) 451, a random access memory (RAM) 452, a read-only memory (ROM) 453, a central processing unit (CPU) 454, and an input/output interface 455 are connected with each other via a bus BUS, and the input/output interface 455 is also connected with a drive 459 for an optical disk, a communication unit 456, such as a modem, an input unit 457, such as a keyboard, and a display unit 458, such as a liquid crystal display panel. Thus, the computer 450 is configured such that the various programs recorded in the hard disk drive 451 are executed by the central processing unit 454 to perform a variety of processing procedures while ensuring a work area in the random access memory 452 according to the settings recorded in the read-only memory 453.

In the computer 450, in addition to such standard computer configuration, the communication unit 456 includes an 8PSK modulation circuit and an analog-digital conversion circuit. In the computer 450, when the user instructs data transmission or reception via the communication unit 456, transmission data is sequentially processed by the central processing unit 454 according to the processing procedure corresponding to the hardware configuration described above to generate coded data, and the 8PSK modulation circuit of the communication unit 456 is activated using the coded data to transmit the data to a communicating party connected via the communication unit 456. Conversely, data received from the communicating party is analog-digital converted by the communication unit 456 to obtain the soft-output on the I and Q axes, and this soft-output received word is sequentially processed according to the processing procedure corresponding to the hardware configuration described above for decoding.

Thus, when encoding and decoding are implemented by such a computer, similar advantages to those of the embodiments described above are achieved. It is to be understood that the hard disk drive 451 and the drive 459 may also implement such encoding and decoding configuration by hardware or software.

As described above, according to the present invention, in second encoding, which is inner coding, a sequence that is not encoded or that is encoded so as to produce a finite impulse response and a sequence that is encoded so as to produce an infinite impulse response are output, and, in interleaving before the second coding, the sequences are permuted so as not to be mixed with each other, thus improving the performance over the related art.

INDUSTRIAL APPLICABILITY

The present invention relates to an encoding device, an encoding method, an encoding program, a decoding device, a decoding method, and a decoding program. In particular, the present invention is applicable to serial concatenated coding and serial concatenated trellis coded modulation.

The invention claimed is:

1. An encoding device for performing serial concatenated coding on k bit sequences of input data, said encoding device comprising:
a first encoding means for encoding the input data with code rate k/p to output p bit sequences of data;
a permuting means for permuting the p bit sequences of data and outputting the permuted data; and
a second encoding means for encoding the p bit sequences of data output from the permuting means with code rate p/n to output n bit sequences of data,
wherein,
the second encoding means outputs the n bit sequences of data,
one or more bit sequences of the p bit sequences of data output from the permuting means are not encoded or are encoded so as to produce a finite impulse response and the remaining bit sequences of data are encoded so as to produce an infinite impulse response, and
the permuting means permutes the p bit sequences of data so that the sequences that are encoded so as to produce an infinite impulse response by the second encoding means are not mixed with the bit sequence or sequences used to produce the finite impulse response, and outputs the permuted data.

2. An encoding device according to claim 1, further comprising a mapping means for mapping the n bit sequences of data onto a transmission symbol according to a predetermined modulation scheme, wherein a serial concatenated trellis coded modulation is performed.

3. An encoding device according to claim 1, wherein the permuting means does not permute the finite impulse response bit sequence or sequences, which are then output.

4. An encoding device according to claim 1, wherein the first encoding means outputs the bit sequences that are encoded so as to produce an infinite impulse response by the second encoding means via the permuting means with a minimum Hamming distance of 2 or more.

5. An encoding device according to claim 1, wherein the first encoding means outputs the bit sequences that are encoded so as to produce an infinite impulse response by the second encoding means via the permuting means with a minimum Hamming distance of 2.

6. An encoding device according to claim 1, wherein the number of bit sequences that are encoded so as to produce an infinite impulse response by the second encoding means is k or more.

7. An encoding device according to claim 1, wherein the number of bit sequences that are encoded so as to produce an infinite impulse response by the second encoding means is k.

8. An encoding device according to claim 1, wherein the first encoding means outputs the p bit sequences of data, consisting of k output bit sequences of catastrophic code whose code rate is k/k and whose minimum output Hamming distance is 2, and (p-k) bit sequences of the k bit sequences of input data.

9. An encoding device according to claim 1, wherein second encoding means uses a catastrophic code with code rate 1 as a code for performing coding so as to produce an infinite impulse response.

10. An encoding device according to claim 1, wherein when the other finite impulse response bit sequence or sequences that are supplied to the second encoding means via the permuting means differ by 1-bit, the first encoding means performs coding so that the bit sequences that are encoded so as to produce an infinite impulse response and that are supplied to the second encoding means via the permuting means do not differ by a predetermined number of bits or more.

11. An encoding device according to claim 1, wherein the permuting means permutes the p bit sequences of data so that data belonging to the same sequence of input bits belongs to a predetermined sequence of output bits.

12. An encoding device according to claim 11, wherein the permuting means permutes the p bit sequences of data in a different order from one sequence to another.

13. An encoding device according to claim 11, wherein the permuting means permutes the p bit sequences of data in the same order for all sequences.

14. An encoding device according to claim 11, wherein the permuting means permutes the p bit sequences of data in the same order for at least two of the sequences.

15. An encoding device according to claim 11, wherein the permuting means permutes the p bit sequences of data in a random order for each sequence.

16. An encoding device according to claim 11, wherein the permuting means permutes the p bit sequences of data so that data whose input order is within a predetermined range of separation between bits has an output order with a separation between the bits which is greater than the predetermined range.

17. An encoding device according to claim 1, wherein the permuting means is formed of a plurality of circuit blocks each for permuting one or a plurality of the bit sequences.

18. An encoding device according to claim 1, wherein the permuting means is formed of a single circuit block.

19. An encoding device according to claim 1, wherein the first and/or second encoding means comprises convolutional encoding means.

20. An encoding device according to claim 1, wherein the code rate k/p is less than 1.

21. An encoding device according to claim 1, wherein p is (k+1).

22. An encoding device according to claim 1, wherein p is (k+a), where a is an integer of 2 or more, and k is a multiple of a.

23. An encoding device according to claim 1, wherein the code rate p/n is 1 or more.

24. An encoding device according to claim 1, wherein the code rate p/n is 1.

25. An encoding device according to claim 2, wherein the mapping means maps n bits of the n bit sequences of data, which are output at one time, onto one transmission symbol in $2^n$-level modulation.

26. An encoding method for performing serial concatenated coding on k bit sequences of input data, said encoding method comprising: a first encoding step of encoding the input data with code rate k/p and outputting p bit sequences of data; a permuting step of permuting the order of the p bit sequences of data and outputting the permuted data; and a second encoding step of encoding the p bit sequences of data permuted in the permuting step with code rate p/n and outputting n bit sequences of data, wherein the second encoding step includes outputting the n bit sequences of data, wherein one or more bit sequences of the p bit sequences of data permuted in the permuting step are not encoded or are encoded so as to produce a finite impulse response and the remaining bit sequences of data are encoded so as to produce an infinite impulse response, and the permuting step includes permuting the p bit sequences of data so that the bit sequences that are encoded so as to produce an infinite impulse response in the second encoding step are not mixed with the other bit sequence or sequences, and outputting the permuted data.

27. An encoding program that causes a computer to execute a predetermined procedure to perform serial concatenated coding on k bit sequences of input data, the procedure including: a first encoding step of encoding the input data with code rate k/p and outputting p bit sequences of data; a permuting step of permuting the order of the p bit sequences of data and outputting the permuted data; and a second encoding step of encoding the p bit sequences of data permuted in the permuting step with code rate p/n and outputting n bit sequences of data, wherein the second encoding step includes outputting the n bit sequences of data, wherein one or more bit sequences of the p bit sequences of data permuted in the permuting step are not encoded or are encoded so as to produce a finite impulse response and the remaining bit sequences of data are encoded so as to produce an infinite impulse response, and the permuting step includes permuting the p bit sequences of data so that the bit sequences that are encoded so as to produce an infinite impulse response in the second encoding step are not mixed with the other bit sequence or sequences, and outputting the permuted data.

* * * * *